(12) United States Patent
Martinez Nuevo et al.

(10) Patent No.: US 9,331,721 B2
(45) Date of Patent: May 3, 2016

(54) SYSTEMS, DEVICES, AND METHODS FOR CONTINUOUS TIME SIGNAL PROCESSING

(71) Applicant: THE TRUSTEES OF COLUMBIA UNIVERSITY IN THE CITY OF NEW YORK, New York, NY (US)

(72) Inventors: Pablo Martinez Nuevo, New York, NY (US); Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/874,215

(22) Filed: Apr. 30, 2013

(65) Prior Publication Data
US 2013/0287136 A1    Oct. 31, 2013

Related U.S. Application Data

(60) Provisional application No. 61/640,207, filed on Apr. 30, 2012.

(51) Int. Cl.
| | |
|---|---|
| *H04L 7/00* | (2006.01) |
| *H04B 1/04* | (2006.01) |
| *H03M 7/00* | (2006.01) |
| *H03M 1/12* | (2006.01) |

(52) U.S. Cl.
CPC .............. *H04B 1/0475* (2013.01); *H03M 1/127* (2013.01); *H03M 7/00* (2013.01)

(58) Field of Classification Search
CPC ....... H04B 1/0475; H03M 1/127; H03M 7/00
USPC ......................................................... 375/355
See application file for complete search history.

(56) References Cited

U.S. PATENT DOCUMENTS

| | | | |
|---|---|---|---|
| 2010/0195770 A1* | 8/2010 | Ricci et al. ..................... 375/322 |
| 2011/0066053 A1* | 3/2011 | Yazicioglu .................... 600/509 |

OTHER PUBLICATIONS

Beaty et al., "Derivative Sampling for Multiband Signals," Numer. Funct. Anal. and Optimiz., vol. 10, Nos. 9 & 10, No Month Listed 1989 (pp. 875-898).
Beaty, "Short Communication: Multichannel Sampling for Multiband Signals," Signal Processing, vol. 36, No Month Listed 1994 (pp. 133-138).
Bennett, "Spectra of Quantized Signals," Bell System Technical Journal, No Date Listed (pp. 446-472).

(Continued)

*Primary Examiner* — Tanmay Shah
(74) *Attorney, Agent, or Firm* — Wilmer Cutler Pickering Hale and Dorr LLP

(57) ABSTRACT

The present disclosure shows new mechanisms for sampling an input signal. In particular, some embodiments of the present disclosure include a new type of a level-crossing sampling mechanism called a derivative level-crossing sampling (D-LCS). At a high level, D-LCS involves quantizing the derivative of an input signal when the derivative of the input signal crosses one of the quantization thresholds. For certain class of signals, the derivative of the input signal can vary at a slower speed compared to the amplitude of the input signal. Therefore, by sampling the derivative of the input signal, instead of the input signal itself, the number of samples per unit time can be reduced.

15 Claims, 25 Drawing Sheets

(56) References Cited

OTHER PUBLICATIONS

Guan et al., "Adaptive Reference Levels in a Level-Crossing Analog-to-Digital Converter," Hindawi Publishing Corporation, EURASIP Journal on Advances in Signal Processing, vol. 2008, No Month Listed 2008 (11 pages).

Guan et al., "Opportunistic Sampling by Level-Crossing," IEEE International Conference on Acoustics, Speech and Signal Processing, No Month Listed 2007 (pp. III-1513-III-1516).

Guan et al., "Opportunistic Sampling of Bursty Signals by Level-Crossing—An Information Theoretical Approach," IEEE, No Month Listed 2007 (pp. 701-707).

Kurchuk et al., "Signal-Dependent Variable-Resolution Clockless A/D Conversion with Application to Continuous-Time Digital Signal Processing," IEEE Transactions on Circuits and Systems—I: Regular Papers, vol. 57, No. 5, May 2010 (pp. 982-991).

Li et al., "A Continuous-Time Programmable Digital FIR Filter," IEEE Journal of Solid-State Circuits, vol. 41, No. 11, Nov. 2006 (pp. 2512-2520).

Mostafa et al., "Adaptive Sampling of Speech Signals," IEEE Transactions on Communications, vol. COM-22, No. 9, Sep. 1974 (pp. 1189-1194).

Nakhai et al., "Application of Extremum Sampling in Speech Coding," Department of Electronic Engineering, No Date Listed (pp. 3842-3845).

Pan et al., "Spectral Spurs due to Quantization in Nyquist ADCs," IEEE Transactions on Circuits and Systems—I: Regular Papers, vol. 51, No. 8, Aug. 2004 (pp. 1422-1439).

Papoulis, "Generalized Sampling Expansion," IEEE Transactions on Circuits and Systems, vol. CAS-24, No. 11. Nov. 1977 (pp. 652-654).

Schell et al., "Analysis and Simulation of Continuous-Time Digital Signal Processors," Signal Processing, vol. 89, No Month Listed 2009 (pp. 2013-2026).

Schell et al., "Analysis of Continuous-Time Digital Signal Processors," IEEE, No Month Listed 2007 (pp. 2232-2235).

Tsividis, "Continuous-Time Digital Signal Processing," Electronic Letters, vol. 39, No. 21, Oct. 16, 2003 (2 pages).

Tsividis, "Mixed-Domain Systems and Signal Processing Based on Input Decomposition," IEEE Transactions on Circuits and Systems—I: Regular Papers, vol. 53, No. 10, Oct. 2006 (pp. 2145-2156).

\* cited by examiner

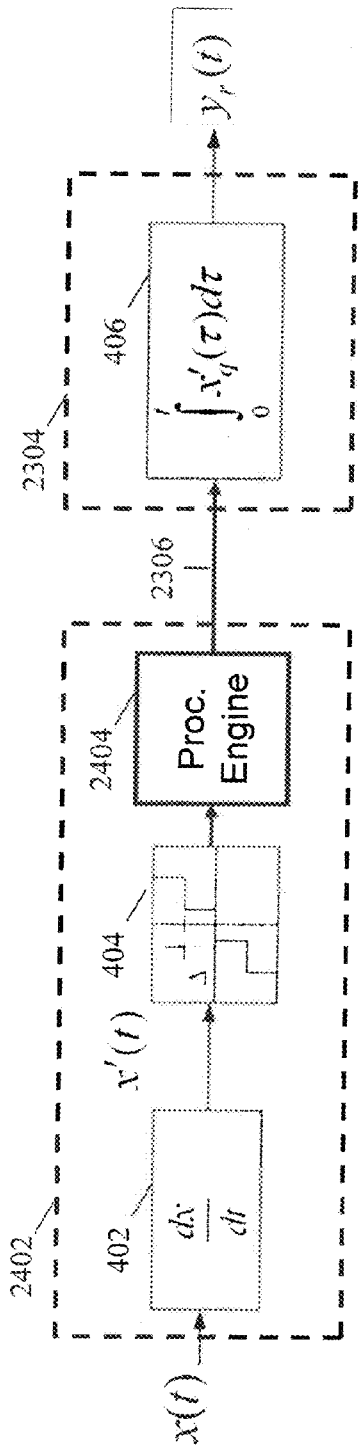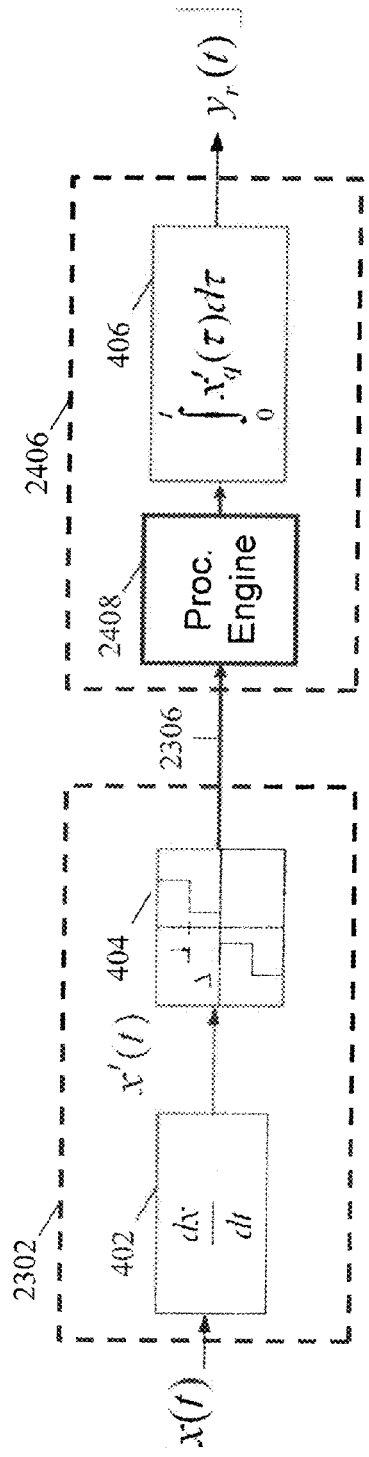
FIG. 24A
FIG. 24B

SYSTEMS, DEVICES, AND METHODS FOR CONTINUOUS TIME SIGNAL PROCESSING

CROSS-REFERENCE TO RELATED APPLICATION

This application claims the benefit of the earlier priority date of U.S. Provisional Patent Application No. 61/640,207, entitled "SYSTEMS, DEVICES, AND METHODS FOR DERIVATIVE LEVEL-CROSSING SAMPLING," by Nuevo et al., filed on Apr. 30, 2012, which is expressly hereby incorporated by reference herein in its entirety. This application is also related to a U.S. patent application Ser. No. 13/501,197, entitled "SYSTEMS, DEVICES, AND METHODS FOR CONTINUOUS-TIME DIGITAL SIGNAL PROCESSING AND SIGNAL REPRESENTATION," by Kurchuk et al., filed on Apr. 10, 2012, which is expressly hereby incorporated by reference herein in its entirety.

STATEMENT REGARDING FEDERALLY SPONSORED RESEARCH OR DEVELOPMENT

This invention was made with government support under CCF-0965606 awarded by the National Science Foundation (NSF). The government has certain rights in the invention.

FIELD OF THE DISCLOSURE

This disclosure relates to systems, devices, and methods for processing signals and representing signals.

BACKGROUND

Converting analog signals into digital signals is typically done using discrete-time sampling, quantization and coding in an analog to digital converter. This involves measuring the amplitude of the signal at regular, discrete time intervals, often determined by the Nyquist-Shannon sampling theorem.

There are a number of disadvantages to using discrete-time digital signals. For example, in conventional discrete-time digital signal processors (DSP), the clock signal that triggers the sampling runs at a frequency that is at least twice as high as the highest frequency of interest in an input signal. This clock has to run continually at that frequency even if there is no signal or there is no high-frequency component that needs to be processed, and this can result in a significant waste of power.

In addition, conventional DSPs suffer from aliasing and quantization error. Aliasing occurs due to the lack of correspondences between the sample sequence and the continuous signal itself, resulting in distortion that is present when the signal is reconstructed from the samples. Quantization error is produced by the inaccuracies inherent in turning a continuous amplitude range of an analog input signal into discrete levels of a digitized signal, and these errors can be spread across all frequencies in a conventional DSP. Techniques such as dithering and non-uniform sampling may reduce or modify one or both of these undesired effects, but residual aliasing and/or quantization noise typically remains even after applying such techniques.

SUMMARY

The present disclosure relates to systems, devices, and methods for continuous-time digital signal processing and signal representation. In particular, the present disclosure relates to an analog to digital (A-to-D) signal conversion mechanism that can convert an input analog signal into a continuous-time digital representation. The disclosed A-to-D signal conversion mechanism can reduce the number of samples for representing an analog signal, which can improve the energy efficiency/power efficiency of the A-to-D signal conversion. Furthermore, the disclosed A-to-D signal conversion mechanism can also enable an efficient processing of the input signal in the continuous-time digital domain. The disclosed embodiments of the A-to-D signal conversion mechanism can include a differentiator configured to receive an input signal and to provide a derivative of the input signal, and a quantizer coupled to the differentiator, configured to receive the derivative of the input signal and to sample the derivative of the input signal when the derivative of the input signal crosses one of a plurality of quantization thresholds to provide a quantized derivative of the input signal.

In one aspect, the present disclosure relates to a circuit system including a differentiator configured to receive an input signal and to provide a derivative of the input signal; and a quantizer coupled to the differentiator, configured to receive the derivative of the input signal and to sample the derivative of the input signal when the derivative of the input signal crosses one of a plurality of quantization thresholds to provide a quantized derivative of the input signal. In some embodiments, the quantizer is configured to represent the quantized derivative of the input signal using a per-level representation. In some embodiments, the quantizer comprises a flash analog-to-digital converter. In some embodiments, the quantizer is associated with a finite offset voltage, and wherein the circuit system can include a feedback system configured to compensate for the finite offset voltage associated with the quantizer. In some embodiments, a continuous time digital signal processing block can be coupled to the quantizer, configured to receive the quantized derivative of the input signal and to process the quantized derivative of the input signal to provide a derivative of an output signal; and an integrator can be coupled to the continuous time signal processor, configured to receive the derivative of the output signal and to integrate the derivative of the output signal to provide the output signal. In some embodiments, the continuous time digital signal processing block can include at least one analog multiplier and a summation block. In some embodiments, the continuous time digital signal processing block can be configured to receive the quantized derivative of the input signal represented in a per-level representation. In some embodiments, the integrator can be associated with a finite offset voltage, and wherein the circuit system further can include a feedback system configured to compensate for the finite offset voltage associated with the integrator. In some embodiments, the input signal can include a bio-signal from a human body.

In another aspect, the present disclosure relates to a method of processing an input signal using a circuit system. In some embodiments, the method includes receiving, at a differentiator, the input signal; determining, using the differentiator, a derivative of the input signal; determining, using a quantizer coupled to the differentiator, a plurality of time points at which the derivative of the input signal crosses one of a plurality of quantization thresholds; and sampling, using the quantizer, the derivative of the input signal at the plurality of time points to provide a quantized derivative of the input signal. In some embodiments, the method can include processing the quantized derivative of the input signal to provide a derivative of an output signal. In some embodiments, sampling the derivative of the input signal at the plurality of time points to provide the quantized derivative of the input signal can include determining a per-level representation of the quantized derivative of the input signal. In some embodiments, the method can include integrating, using an integrator, the derivative of the output signal to provide the output signal. In some embodiments, the plurality of quantization thresholds can include a first quantization threshold, a second quantization threshold, and a third quantization threshold, wherein the first quantization threshold, the second quantization threshold, and the third quantization threshold are consecutive thresholds, and wherein a first difference between the first quantization threshold and the second quantization threshold is different from a second difference between the second quantization threshold and the third quantization threshold. In some embodiments, the quantizer can be associated with a finite offset voltage, and wherein the method can include compensating for the finite offset voltage associated with the quantizer using a feedback system. In some embodiments, the integrator can be associated with a finite offset voltage, and the method further can include compensating for the finite offset voltage associated with the integrator using a feedback system.

In another aspect, the present disclosure relates to a communication system for communicating over a communication channel. In some embodiments, the communication system can include a differentiator configured to receive an input signal and to provide a derivative of the input signal; a quantizer coupled to the differentiator, configured to receive the derivative of the input signal and to sample the derivative of the input signal when the derivative of the input signal crosses one of a plurality of quantization thresholds to provide a quantized derivative of the input signal; and a transmission block coupled to the quantizer, configured to receive the quantized derivative of the input signal and to transmit the quantized derivative of the input signal over the communication channel. In some embodiments, the communication system can include a continuous time digital signal processing block coupled to the quantizer, configured to receive the quantized derivative of the input signal and to process the quantized derivative of the input signal to provide a processed quantized derivative of the input signal to the transmitter, wherein the transmission block can be configured to transmit the processed quantized derivative of the input signal over the communication channel. In some embodiments, the communication system can include a receiver, configured to receive the quantized derivative of the input signal from the communication channel, further configured to integrate the quantized derivative of the input signal to provide an output signal. In some embodiments, the input signal can be a bio-signal from a human body.

DESCRIPTION OF DRAWINGS

FIGS. 24A-24B illustrate a flexible communication system based on the D-LCS scheme in accordance with some embodiments.

DETAILED DESCRIPTION

Analog to digital converters (ADCs) can convert continuous signals, such as, for example, sound signals, into their digital representations. Most ADCs convert signals by sampling them at a fixed, uniform time interval. The fixed time interval can be determined according to the Nyquist-Shannon sampling theorem. While sampling signals at the Nyquist rate can be effective for uniform signals (e.g., a sinusoid) or signals with a limited bandwidth, it can be ineffective for non-sparse signals, such as those present in biological applications.

One mechanism for addressing this issue is level-crossing sampling (LCS.) LCS relates to sampling an input signal only when it crosses one of the quantization thresholds. This mechanism allows the signal to determine the rate of data acquisition, resulting in important reductions in power dissipation for non-uniform and/or bursty signals. LCS can be equivalent to passing the signal through a quantizer without explicitly defining the time instance to sample the signal. Therefore, a new digital output can be produced whenever the signal crosses a quantization threshold.

The output from LCS can be processed digitally in continuous time (CT) without using a clock signal. This approach has been termed CT digital signal processing (CT DSP). CT DSP can benefit from advantages of digital systems, but CT DSP does not suffer from some of the disadvantages of digital systems. For example, because CT DSP does not use a clock to sample the signal, CT DSP does not suffer from temporal aliasing.

Figure 1:
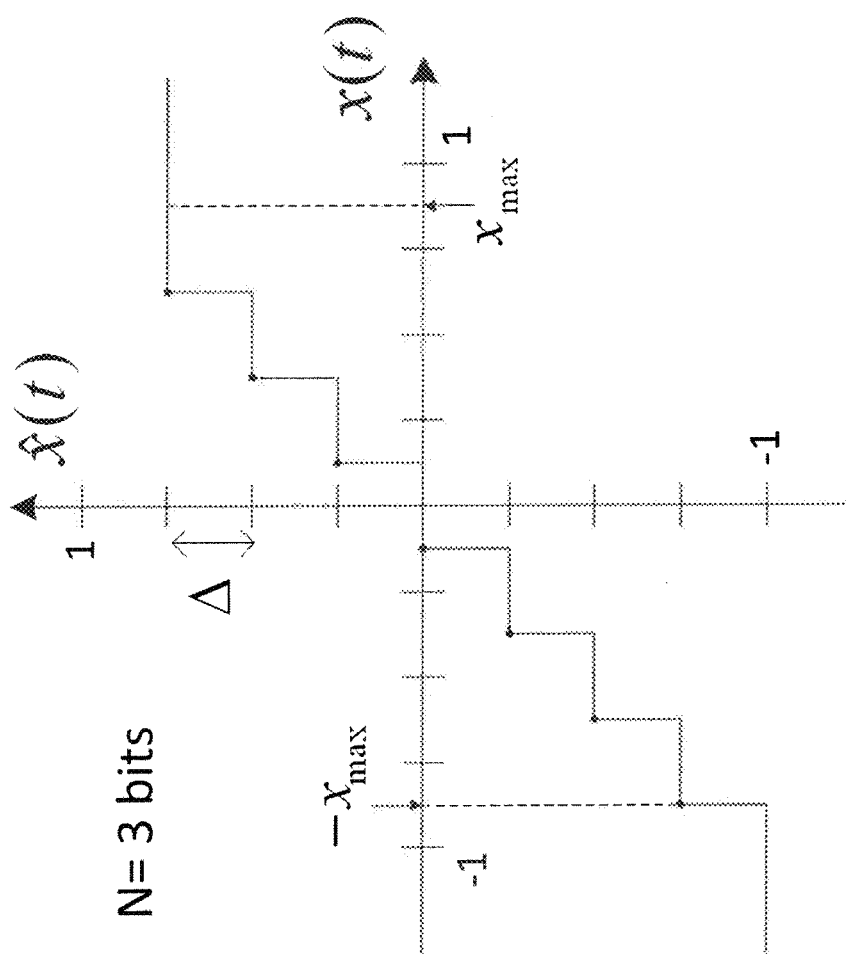
FIG. 1 illustrates the level-crossing sampling mechanism in accordance with some embodiments.

FIG. 1 illustrates a level-crossing sampling mechanism in accordance with some embodiments. As mentioned before, LCS can be equivalent to quantizing the signal without sampling. Therefore, for an input signal x(t), the quantizer computes its output x̂(t) whenever a quantization threshold is crossed. FIG. 1 shows an example of a 3-bit mid-tread quantizer for a range of amplitudes between [−1,1]. The quantization step $\Delta$ can be computed as follows:

$$\Delta(1-(-1))/2^3=0.25$$

In some embodiments, the quantizer can be designed to maintain an odd symmetry in the transfer function. In this case, the amplitude of the input signal can be restricted to a maximum value. For example, in FIG. 1, the maximum value is restricted to:

$$x_{max} = 1 - \left(\frac{1}{2^3}\right) = 0.875$$

One of ordinary skill in the art can generalize the 3-bit quantizer, as disclosed in FIG. 1, to N-bit quantizers.

Quantization principles of LCS can be illustrated using a sinusoidal input signal. It is known in the art that the output of a quantizer for a periodic input is also periodic. Thus, it is possible to express the quantized sinusoidal signal as a Fourier series. This Fourier series can have non-zero coefficients at the signal's dominant frequency and its harmonics. The harmonics can be caused by the quantization error e=x(t)−x̂(t).

Figure 2:
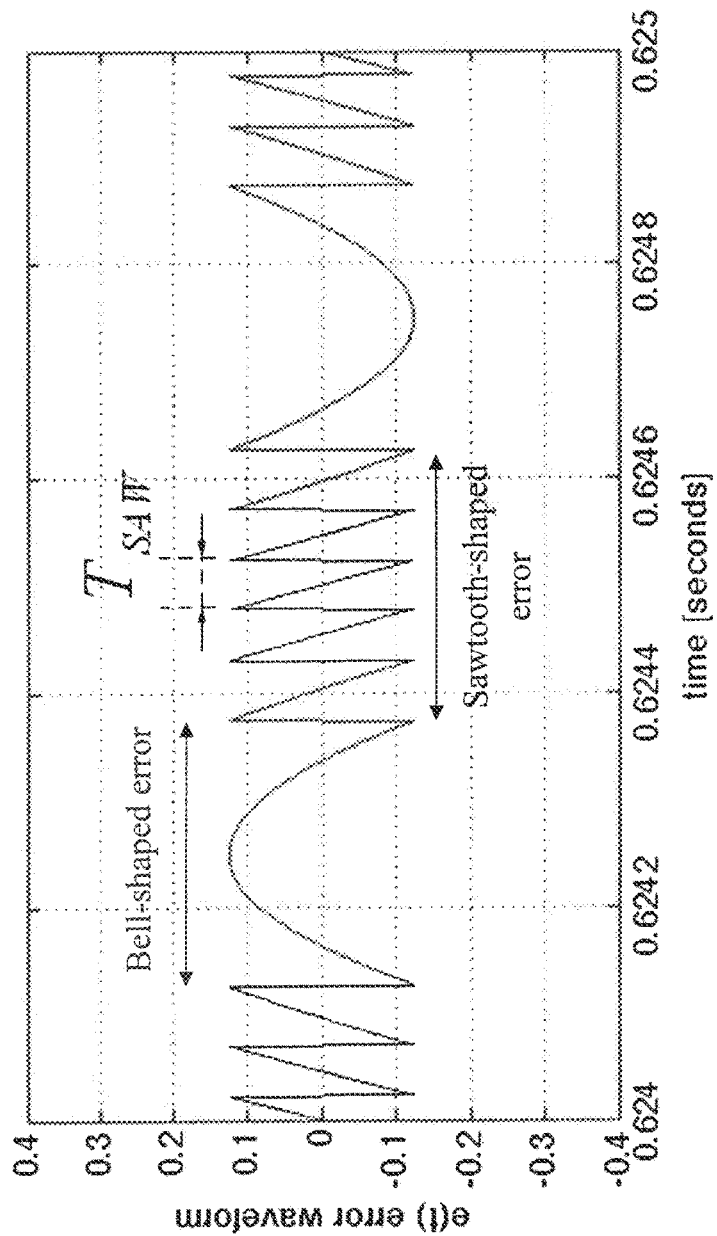
FIG. 2 illustrates the quantization error waveform for a sinusoidal input signal, in accordance with some embodiments.
Figure 3:
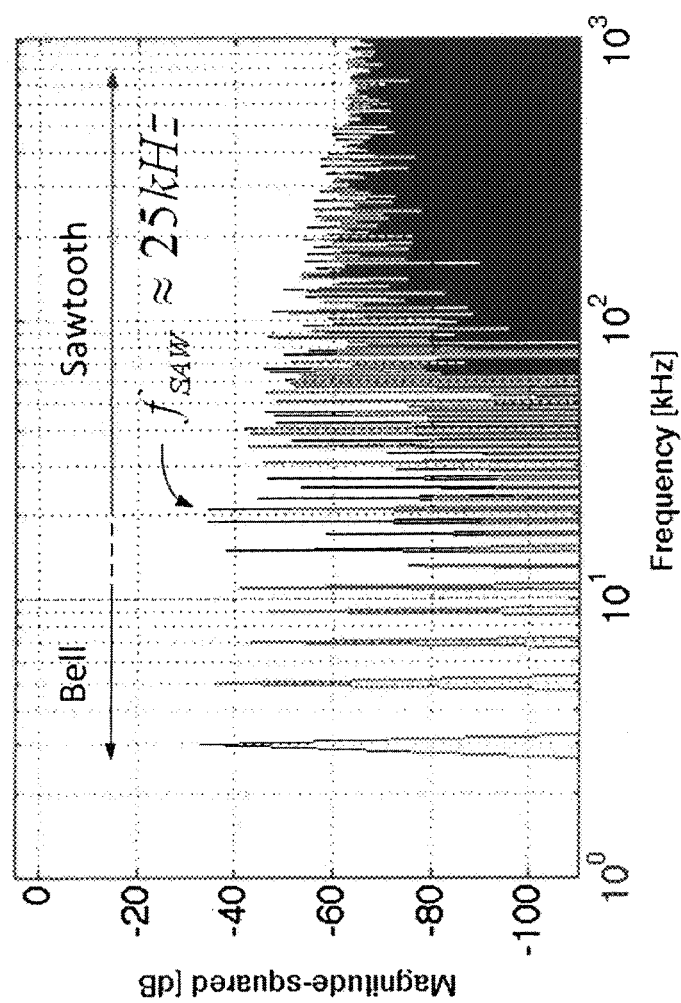
FIG. 3 illustrates the quantization error spectrum for a sinusoidal input signal in accordance with some embodiments.

FIG. 2 illustrates a quantization error waveform for a sinusoidal input signal, in accordance with some embodiments. The quantization error waveform can be partitioned into a bell-shaped error waveform $e_{BELL}$ and a saw tooth-like waveform $e_{SAW}$. The two different error waveforms contribute differently to the error. For example, the bell-shaped error waveform $e_{BELL}$, can contribute to the low-frequency distortion and the saw tooth-like waveform $e_{SAW}$ can contribute to the high-frequency distortion mostly placed outside the baseband. FIG. 3 illustrates the quantization error spectrum for a sinusoidal input signal in accordance with some embodiments. The sinusoidal input signal has unit amplitude, and the quantizer used for FIG. 3 is a 3-bit mid-tread quantizer. FIG. 3 graphically illustrates that the bell-shaped error waveform and the saw tooth-like waveform contribute to error in different bands.

The largest distortion spur occur at $f_{SAW}$, which can be approximated as the minimum of the saw tooth duration. For example, the minimum tooth duration, for a sinusoidal input of the form, $A \sin(2\pi f_{IN} t)$, can be shown to be:

$$T_{SAW,min} = \frac{\Delta}{2\pi A f_{IN}}$$

where $f_{SAW}$ can be approximated by the inverse of the minimum tooth duration. The largest distortion spur $f_{SAW}$ moves away from the input frequency as the quantization step $\Delta$, is reduced. FIG. 3 illustrates the largest distortion spur $f_{SAW}$ for unit amplitude and $f_{IN}=1$ kHz.

The reconstruction approximation can be assessed using the in-band signal to error ratio (SER). The in-band SER is defined as the ratio of the signal to quantization error and noise in the band of interest. In some cases, the in-band SER can be primarily due to the bell-shaped error.

One potential disadvantage of LCS is the large number of samples. For certain signals, the LCS scheme can generate a large number of samples per unit time compared to the traditional Nyquist sampling scheme. For example, if a signal is temporally varied around a quantization threshold of the quantizer, then LCS would sample the signal whenever the signal crosses the quantization threshold. Thus, for such signals, LCS scheme can generate a large number of samples per unit time compared to the traditional Nyquist sampling scheme This issue can be partially addressed using an adaptive quantizer that adjusts the resolution of the quantizer based on the input signal activity. For example, the resolution of the quantizer can be decreased for fast inputs and increased for slow-varying portions. Because the largest distortion spur $f_{SAW}$ is inversely proportional to the quantization step and directly proportional to $f_{IN}$, the adaptive quantizer can reduce the resolution for fast-varying inputs while keeping the spur $f_{SAW}$ outside the band of interest.

The present disclosure shows new mechanisms to further reduce the number of samples generated per unit time. In particular, some embodiments of the present disclosure include a new type of LCS mechanism called a derivative level-crossing sampling (D-LCS). At a high level, D-LCS involves quantizing the derivative of an input signal when the derivative of the input signal crosses one of the quantization thresholds. For a certain class of signals, the derivative of the input signal can vary at a slower speed compared to the amplitude of the input signal. Therefore, by sampling the derivative of the input signal, instead of the input signal itself, the number of samples per unit time can be reduced.

Figure 4A:
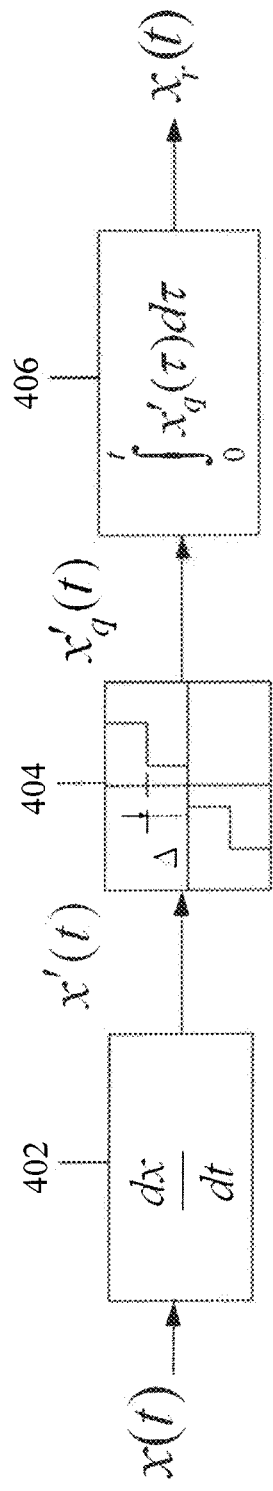
FIGS. 4A-4B illustrate derivative level-crossing sampling (D-LCS) and level-crossing sampling (LCS) in accordance with some embodiments.

FIG. 4A illustrates D-LCS in accordance with some embodiments. FIG. 4A includes a differentiator 402, a quantizer 404, and an integrator 406. The differentiator 402 is configured to differentiate an input signal x(t) to provide a derivative x' (t) of the input signal. The quantizer 404 can receive the derivative x' (t) and quantize the derivative x' (t) to provide the quantized derivative $x_q'$ (t). The quantizer 404 can be configured to sample (or to determine the value of) the derivative x' (t) when the derivative x' (t) crosses one of the quantization thresholds.

In some embodiments, the differentiator 402 can include a high pass filter. In some cases, the high pass filter can be implemented using a passive element. For example, the high pass filter can be implemented using a capacitor in serious with the signal path. In other cases, the high pass filter can be implemented using an active element. For example, the high pass filter can be implemented using an operational amplifier (OPAMP).

In some embodiments, the quantizer 404 can represent the sampled derivative signal as a step-wise approximation to the derivative of the input signal. In other embodiments, the quantizer 404 can represent the sampled signal using a per-level representation. For example, the quantizer 404 can compare the input signal against $2^n$ quantization thresholds, where n is the number of bits for the binary representation of the quantization thresholds, and it can represent the quantized input signal using one or more output signals. In some cases, the one or more output signals can include $2^n$ signals, where each of the $2^n$ signals is associated with a quantization level. An output signal is a logic "1" if the input signal is greater than the quantization level associated with the output signal; and the output signal is a logic "0" if the input signal is smaller than the quantization threshold associated with the output signal. One way of splitting the signal into the $2^n$ signals is using a per-level representation.

Figure 5A:
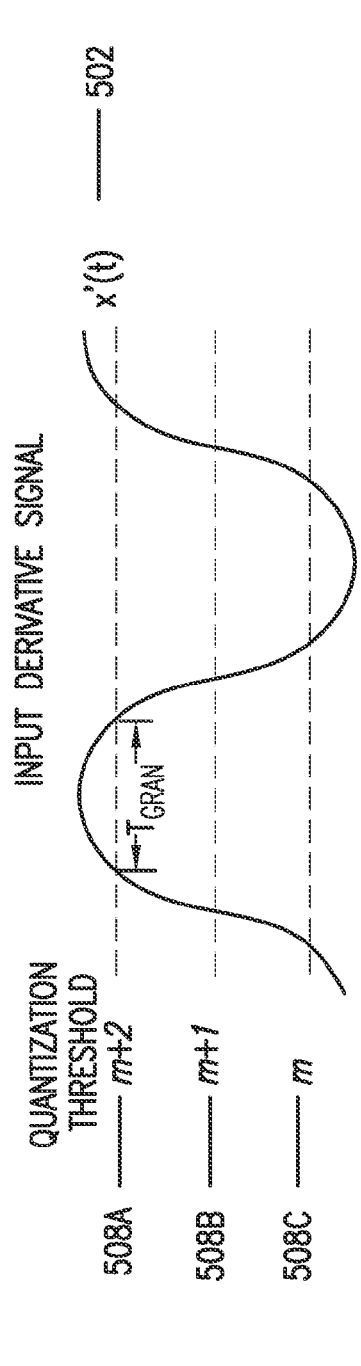
FIGS. 5A-5C illustrate a per-level thermometer representation in accordance with some embodiments.
Figure 5B:
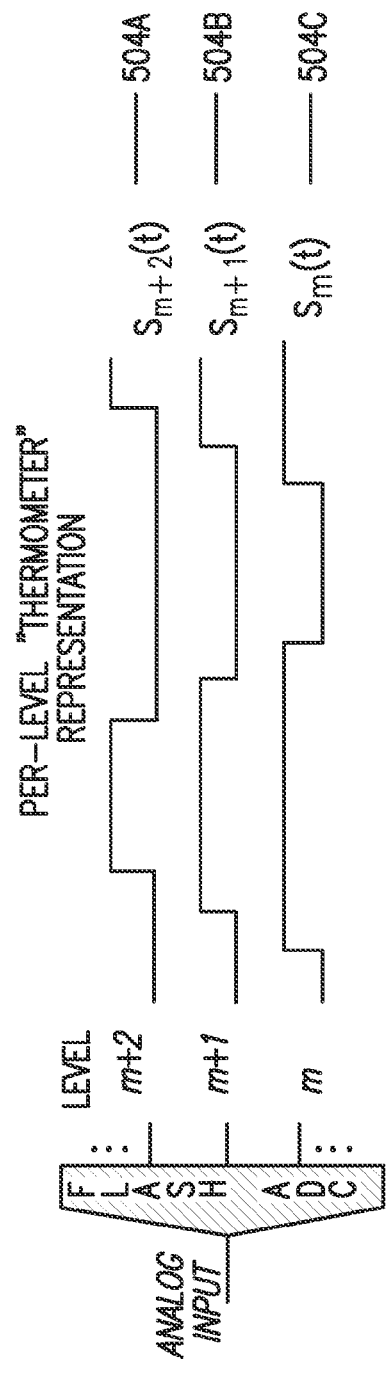
Figure 5C:
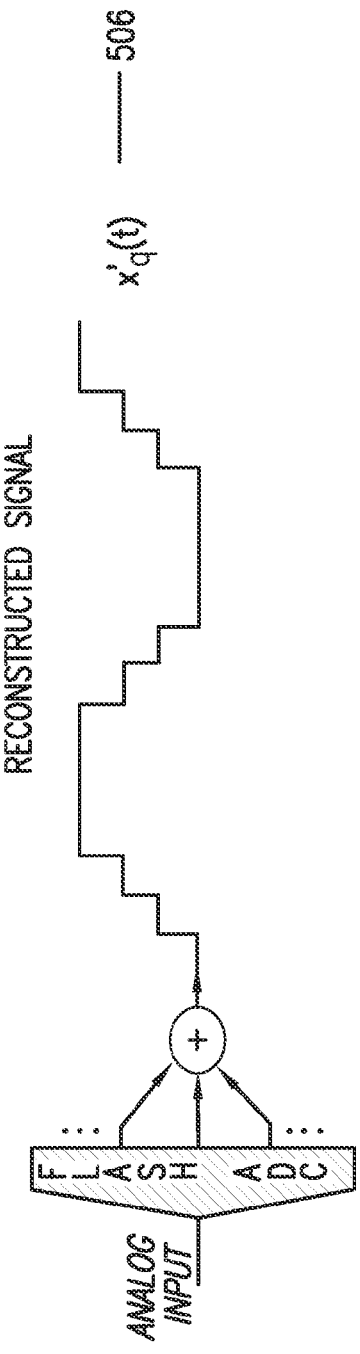

One type of per-level representation is a "thermometer" representation. FIGS. 5A-5C illustrate a thermometer representation in accordance with some embodiments. FIG. 5A illustrates an input derivative signal 502; FIG. 5B illustrates a thermometer representation of the input derivative signal, showing three output signals $s_{m+2}(t)$ 504A, $s_{m+1}(t)$ 504B, and $s_m(t)$ 504C; and FIG. 5C illustrates how the continuous-time equivalent 506 of the thermometer representation $s_{m+2}(t)$ 504A, $s_{m+1}(t)$ 504B, and $s_m(t)$ 504C. In the thermometer representation, an output signal is configured to change its state whenever the input signal crosses a quantization threshold associated with the output signal. For example, the output signal $s_{m+2}(t)$ 504A is triggered to a high state when the input derivative signal 502 crosses the quantization threshold corresponding to the output signal $s_{m+2}(t)$ 504A, which is $T_{m+2}$ 508A. When the input derivative signal 502 crosses the same quantization threshold $T_{m+2}$ 508A at a later time, then the output signal 504A can be triggered to change its state to a low state. Likewise, the output signals $s_{m+1}(t)$ 504B and $s_m(t)$ 504C are triggered to a high state when the input derivative signal 502 crosses the quantization thresholds corresponding to the output signals $s_{m+1}(t)$ 504B and $s_m(t)$ 504C, which are $T_{m+1}$ 508B and $T_m$ 508C, respectively. In some cases, the continuous time equivalent of the thermometer representation (i.e., a step-wise approximation of the derivative of the input signal) can be determined by simply adding the output signals of the thermometer representations as shown in FIG. 5C.

In some embodiments, the quantizer 404 can represent the derivative of the input signal using a per-edge representation. The per-edge representation is disclosed in detail in the U.S. patent application Ser. No. 13/501,197, entitled "SYSTEMS, DEVICES, AND METHODS FOR CONTINUOUS-TIME DIGITAL SIGNAL PROCESSING AND SIGNAL REPRESENTATION," by Kurchuk et al., which is expressly hereby incorporated by reference herein in its entirety.

In some embodiments, the quantizer 404 can represent a quantized derivative of an input signal as a step-wise approximation of the derivative of the input signal. In some cases, the quantizer 404 can generate the step-wise approximation of the derivative of the input signal by summing the per-level representation of the derivative of the input signal, as illustrated in FIG. 5C. In other cases, the quantizer 404 can generate the step-wise approximation of the derivative of the input signal using a sample and hold circuit that is triggered to sample the derivative of the input signal whenever the derivative of the input signal crosses one of the plurality of threshold levels.

The quantizer 404 can be implemented using various circuit blocks. In some embodiments, the quantizer 404 can include two or more comparators. In other embodiments, the quantizer 404 can include an analog to digital converter (ADC). For example, the quantizer 404 can include a flash-based ADC. This flash ADC (also known as a direct conversion ADC) can be implemented using a linear voltage ladder with a comparator at each "rung" of the ladder to compare the input voltage to successive reference voltages. In some embodiments, the quantizer 404 can include two or more comparators. The flash ADC can be implemented using logic such as flip-flops to reduce the number of comparators that are needed to make the comparisons. The quantizer 404 can also include one or more of the following ADCs: a ramp-compare ADC, a Wilkinson ADC, an integrating ADC, a successive-approximation ADC, a delta-encoded ADC, a pipeline ADC, a sigma-delta ADC, a time interleaved ADC, and a time-stretch ADC.

In some embodiments, the quantizer 404 can use a uniform or non-uniform spaced quantization thresholds. For example, a non-linear ADC with non-uniformly spaced quantization thresholds can be used to generate the per-level output signals. Filter coefficients at each level of a subsequent digital filter stage (e.g., in a continuous-time digital signal processor) can be appropriately scaled to achieve non-equal level weights or to alter the transfer characteristic due to the non-linearity of the ADC.

In some embodiments, the number of samples that can be captured by the quantizer 404 within a predetermined period of time can be limited. This feature can be useful when the input signal is band limited and the maximum bandwidth of the signal is known in advance. This feature can prevent the quantizer 404 from unnecessarily capturing data due to, for example, noise. This feature can be implemented by duty-cycling the quantizer 404. For example, when the quantizer 404 samples an input signal, the quantizer 404 can be disabled for a predetermined period of time, during which the quantizer 404 cannot sample the input signal. The predetermined period of time can depend on the bandwidth of the input signal. In some cases, the quantizer 404 can be disabled by decoupling the quantizer 404 from a power source, which can also reduce the power consumption of the quantizer 404.

In some embodiments, the integrator 406 can reconstruct the continuous-time input signal x(t) by integrating the quantized derivative $x_q'(t)$. The integrator 406 can receive the quantized derivative $x_q'(t)$ and integrate it, assuming a certain initial value, to provide a reconstructed input signal $x_r(t)$. The reconstructed input signal $x_r(t)$ can be considered a piecewise approximation of the original input signal x(t). In some embodiments, the quantized derivative $x_q'(t)$ can be processed using a continuous time digital signal processing block to provide a quantized processed derivative $y_q'(t)$, which is the derivative of the desired output signal y(t). The quantized processed derivative $y_q'(t)$ can be integrated using the integrator 406 to provide the desired output signal y(t).

Figure 6A:
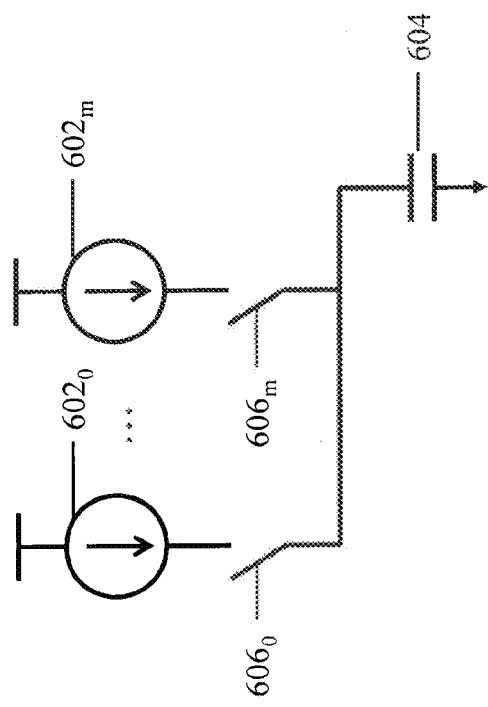
FIGS. 6A-6B illustrate an integrator in accordance with some embodiments.

In some embodiments, the integrator 406 can include one or more current sources and passive components. FIG. 6A illustrates a current-source based integrator in accordance with some embodiments. FIG. 6A includes current sources $602_0 \ldots 602_m$, a capacitor, and switches $606_0 \ldots 606_m$ that selectively couple one or more current sources $602_0 \ldots 602_m$ to the capacitor 604. The current sources $602_0 \ldots 602_m$ and the switches $606_0 \ldots 606_m$ together can comprise a digital to analog converter (DAC). In FIG. 6A, the DAC can convert the digital codes from the quantizer 404 into a current, and the current can be integrated at a capacitor. In some embodiments, the switches $606_0 \ldots 606_m$ in the DAC can be controlled by the per-level signal s(t) 504. In some embodiments, the current output of individual current sources $602_0 \ldots 602_m$ can be different, depending on the per-level signal s(t) 504 associated with the individual current sources 602.

Figure 6B:
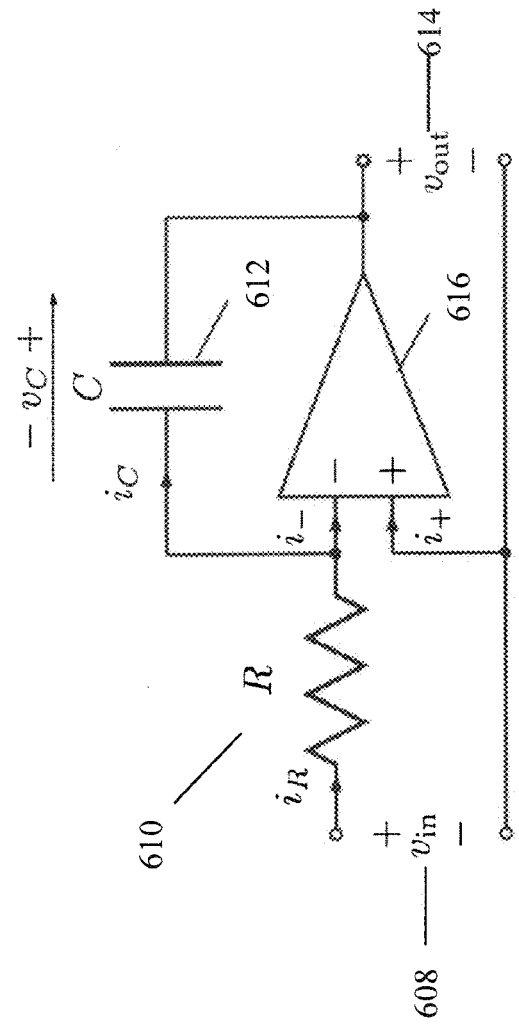

In some embodiments, the integrator 406 can be implemented as an active integrator. FIG. 6B illustrates an active integrator in accordance with some embodiments. The active integrator includes a resistor 610, a capacitor 612, and an operational amplifier (OPAMP) 616. In this illustration, $v_{in}$ 608 can be the sum of all per-level output signals s(t) 504. $v_{in}$ 608 can be converted into current $i_R$ using the resistor R 610, and this current $i_R$ is integrated at the capacitor C 612. The integrated current is manifested as the output voltage $v_{out}$ 614.

Figure 7A:
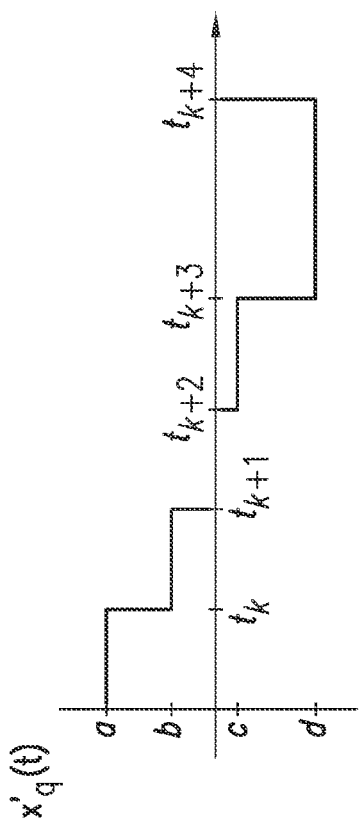
FIGS. 7A-7B illustrate the operation of the D-LCS in accordance with some embodiments.
Figure 7B:
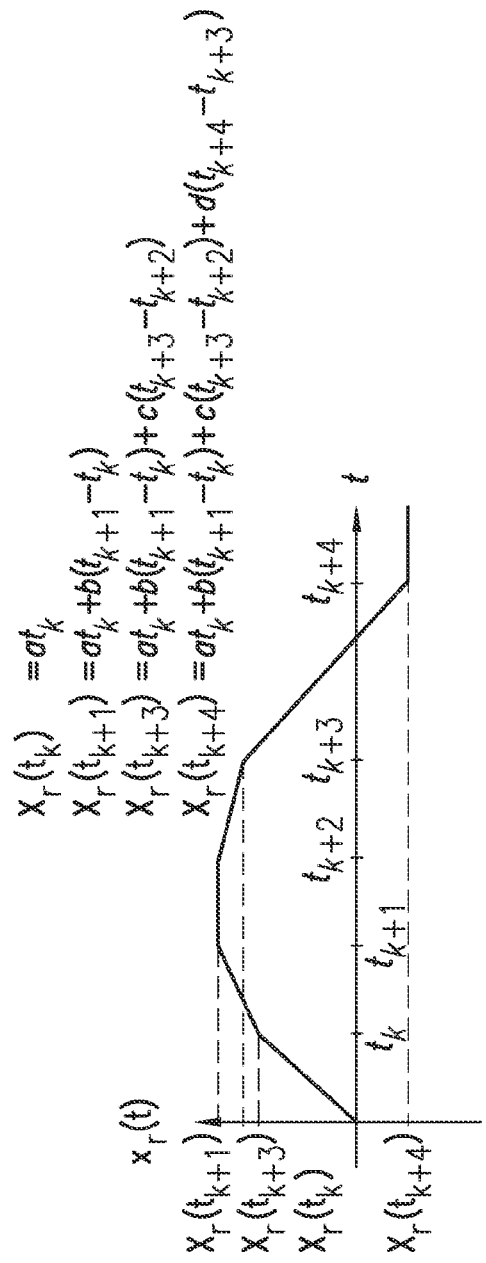

FIGS. 7A-7B illustrate an operation of a derivative level-crossing sampling in accordance with some embodiments. FIG. 7A illustrates quantized derivative values of an input signal, i.e. the output of the quantizer 404, $x_q'(t)$. When the integrator 406 integrates the quantized derivative $x_q'(t)$, the resulting signal $x_r(t)$ can be a piecewise linear signal, as illustrated in FIG. 7B. In this case, the initial value is assumed to be zero, but the initial value can be any value within the possible range of signal amplitudes.

Performance Analysis

Figure 4B:
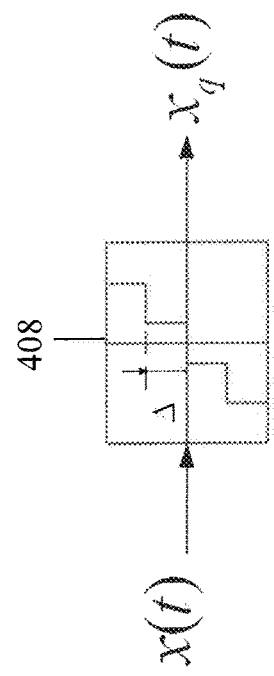

The D-LCS can be compared to the regular LCS. FIG. 4B illustrates regular LCS in accordance with some embodiments. FIG. 4B includes an amplitude quantizer 408. In the regular LCS, the quantizer 408 receives an input signal x(t), not the derivative of the input signal, and provides a quantized input signal $x_q(t)$.

The D-LCS scheme and the regular LCS can be compared based on two factors: the number of generated samples per second and the signal-to-noise-distortion ratio (SNDR). The following paragraphs illustrate that the D-LCS reduces the number of generated samples per unit time and that the D-LCS increases SNDR.

Construction of Analysis

This analysis can consider band-limited signals. In particular, the band-limited signals can be audio signals having a frequency between 0 and 4 kHz. Note that the slope of band-limited signals is limited. The input signal can be represented as a sinusoid:

$$x(t) = \sin(2\pi f t)$$

and its derivative can be computed as follows:

$$x'(t) = \frac{dx(t)}{dt} = 2\pi f \cos(2\pi f t).$$

In order to define the quantization step, it is necessary to know the maximum value of the derivative. To this purpose, the Bernstein's inequality can be used. For a function $f(t)$ band-limited to $$\sigma \left[\frac{rad}{s}\right]:$$

$$|f'(t)| \leq \sigma M$$

where M is the maximum value of $|f(t)|$, i.e. $M = \sup\{|f(t)| : t \in \mathbb{R}\}$.

The derivative quantizer 404 and the amplitude quantizer 408 can be of the type illustrated in FIG. 1. In particular, for a sinusoidal input signal with unit amplitude, the corresponding quantization threshold can be $\Delta_{x(t)} = (1-(-1))2^N$. Taking into account the frequency range of audio signals, the slope of x(t) can be within the range defined as $[-2\pi 4000, 2\pi 4000]$. This leads to a quantization threshold of $\Delta_{x'(t)} = 2(2\pi 4000)/2^N$, where N is the number of bits of the quantizer in both cases. The outputs of the systems will be denoted by $x_q'$ and $x_r(t)$ respectively.

Reduction in the Number of Generated Samples Per Unit Time

Derivative level-crossing sampling can reconstruct the original signal using less number of samples per unit time, compared to the regular level-crossing sampling. This can be analytically and experimentally shown as follows. Let V be the space of continuous $L^2(\mathbb{R})$ functions piecewise linear over non-uniform intervals $[t_m, t_{m+1})$, m non-negative integer with $t_0 = 0$ and $t_m \geq 0$, zero for $t \leq 0$ and slopes determined by the finite set $\{s_k\}_{k=1}^{2^{N-1}}$, $s_k \in \mathbb{R}$. Therefore, if $x(t) \in V$, then $x'(t)$ is piecewise constant over intervals $[t_m, t_{m+1})$. In fact, $x'(t)$ is specified by the sequence $\{s_i\}_{i \in \mathbb{N}}$, which includes the slopes of x(t) over $[t_m, t_{m+1})$. Therefore, the values of x(t) on the interval $[t_k, t_{k+1})$:

$$x(t) = s_k(t - t_k) + \sum_{i=1}^{k-1} s_i(t_{i+1} - t_i)$$

Then, taking the derivative of x(t) on the intervals $[t_m, t_{m+1})$, $x'(t)$ can be represented as follows within the interval $[t_k, t_{k+1})$:

$$x'(t) = s_k$$

Making use of the quantizers defined herein for x(t) and x'(t), it can be observed that within the intervals $[t_k, t_{k+1})$, x'(t) will only generate one sample. However, the number of samples generated by x(t) on $[t_k, t_{k+1})$, denoted by $N_{samples}^k$, will be given by the following expression:

$$N_{samples}^k = \left\lceil \frac{|x(t_{k+1}) - x(t_k)|}{\Delta_{x(t)}} \right\rceil = \left\lceil \frac{|x(t_{k+1}) - x(t_k)|}{(1-(-1))/2^N} \right\rceil \geq 1$$

where $\lceil \; \rceil$ denotes the ceiling function, i.e., for $x \in \mathbb{R}$, $f(x) = \lceil x \rceil$ is the smallest integer not less than x. Therefore, it can be seen that the number of samples generated per unit time by $x(t) \in V$ can be greater than or equal to the number of samples generated per unit time by x'(t).

Figure 8:
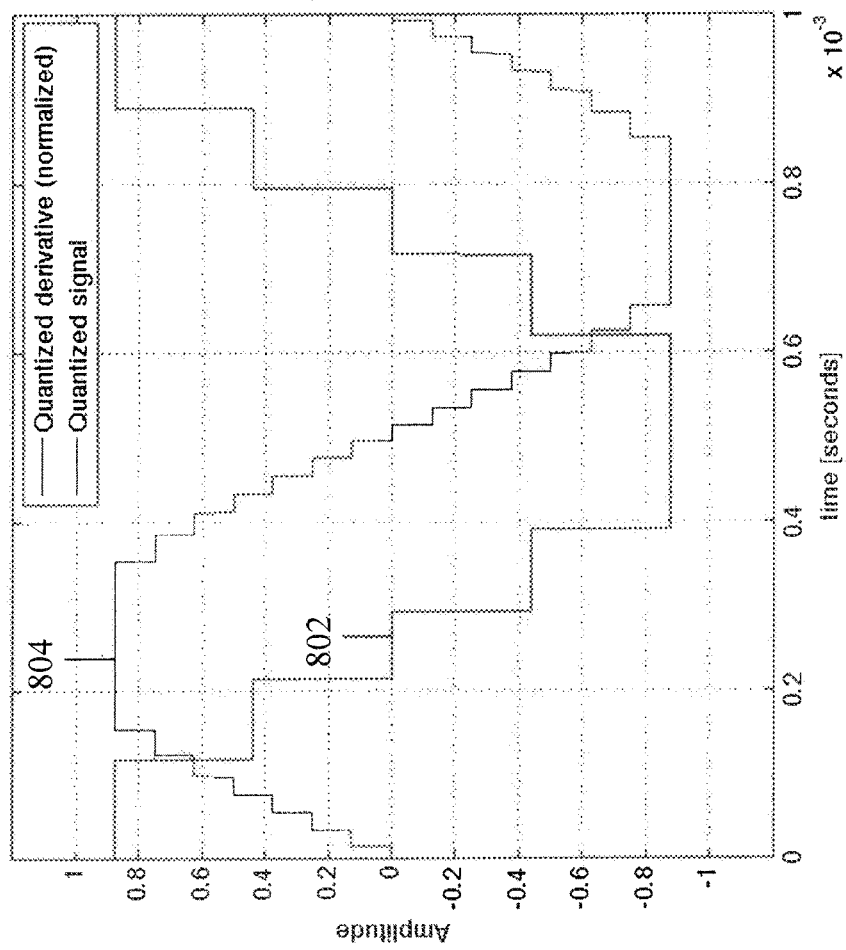
FIG. 8 illustrates normalized a quantized derivative of an input signal, sampled based the D-LCS, and a quantized amplitude of an input signal, sampled based the regular LCS, in accordance with some embodiments.

FIGS. 8 and 9 illustrate advantages of D-LCS for certain types of signals in accordance with some embodiments. FIG. 8 illustrates a normalized quantized derivative $x_q'(t)$ 802 of the input signal and a quantized amplitude $x_q(t)$ 804 of the input signal, in accordance with some embodiments. The input signal is a sinusoid, and different sampling mechanisms are used to generate the quantized derivative of the input signal $x_q'(t)$ 802 and the quantized amplitude of the input signal $x_q(t)$ 804. In particular, the quantized derivative $x_q'(t)$ 802 of the input signal can be generated using a derivative level-crossing sampling mechanism, for example, using the differentiator 402 and the derivative quantizer 404; and the quantized amplitude $x_q(t)$ 804 of the input signal can be generated using the regular level-crossing sampling mechanism, for example, using the amplitude quantizer 408. FIG. 8 shows that the derivative of the input signal is sampled less number of times compared to the amplitude of the input signal. Therefore, FIG. 8 illustrates that the derivative level-crossing sampling can reduce the number of generated samples per unit time for certain types of signals.

Figure 9A:
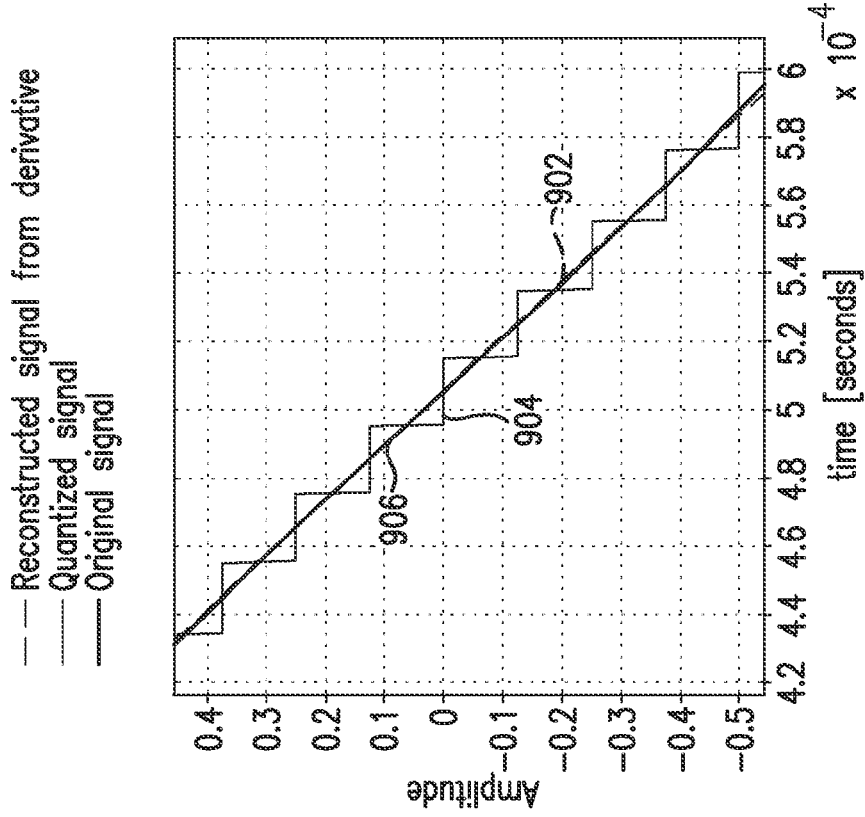
FIGS. 9A-9B illustrate signals reconstructed from the quantized derivative of an input signal and the quantized amplitude of an input signal of FIG. 8, in accordance with some embodiments.
Figure 9B:
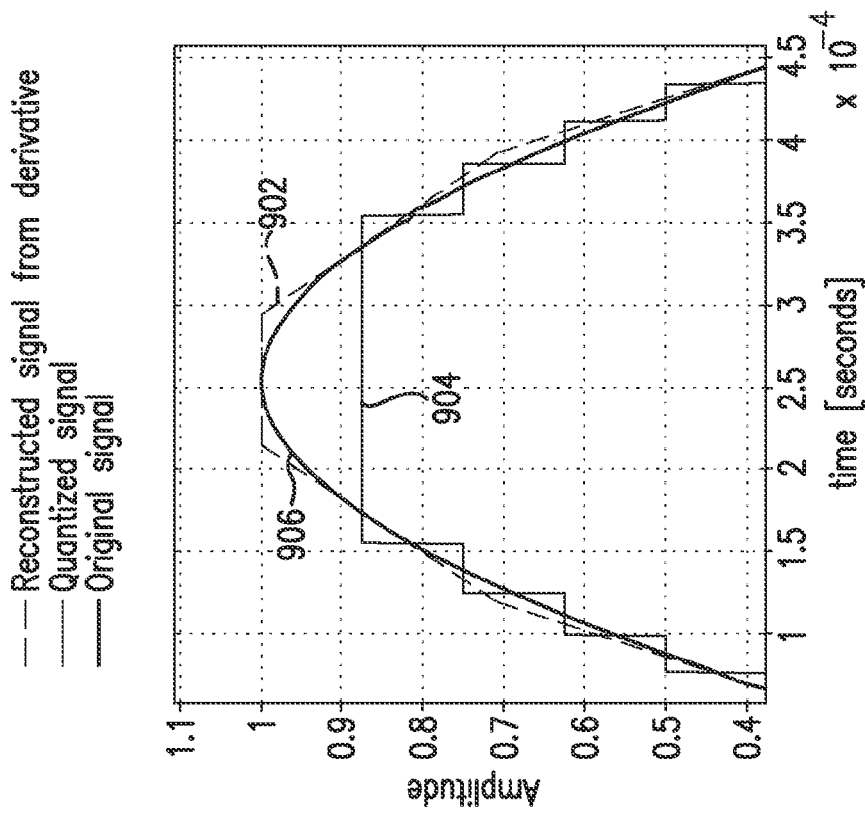

The signal reconstructed from the quantized derivative $x_q'(t)$ 802 can also be closer to the original input signal compared to the signal reconstructed from the quantized amplitude $X_q(t)$ 804. FIG. 9A illustrates the signals reconstructed from the quantized derivative $x_q'(t)$ 802 of the input signal and the quantized amplitude $x_q(t)$ 804 of the input signal, in accordance with some embodiments. The signal 902 is reconstructed from the quantized derivative $x_q'(t)$ 802; and the signal 904 is reconstructed from the quantized amplitude of the input signal $X_q(t)$ 804. The original input signal 906 is also shown for reference. This figure indicates that the signal reconstructed from the quantized derivative $x_q'(t)$ 802 can be closer to the input signal compared to the signal reconstructed from the quantized derivative $x_q'(t)$ 804. FIG. 9B shows a close-up view of a portion of FIG. 9A.

Improvements in Signal-to-Noise-And-Distortion Ratio (SNDR)

Derivative level-crossing sampling can also improve the SNDR of the sampled and reconstructed signals. This analysis only considers in-band distortion, in particular, within 0 and 4 kHz. Also, in order to gauge the dependency on the frequency of the input signal, different frequencies for x(t) were utilized, e.g., 250 Hz, 500 Hz, 1 kHz, 2 kHz, 3 kHz and 3.5 kHz. The sampling frequency used for the Nyquist-rate sampled quantizer has been $f_s$=8000 Hz. Three variables are present in this simulation, i.e. SNDR, number of samples taken per unit time and frequency.

Figure 10:
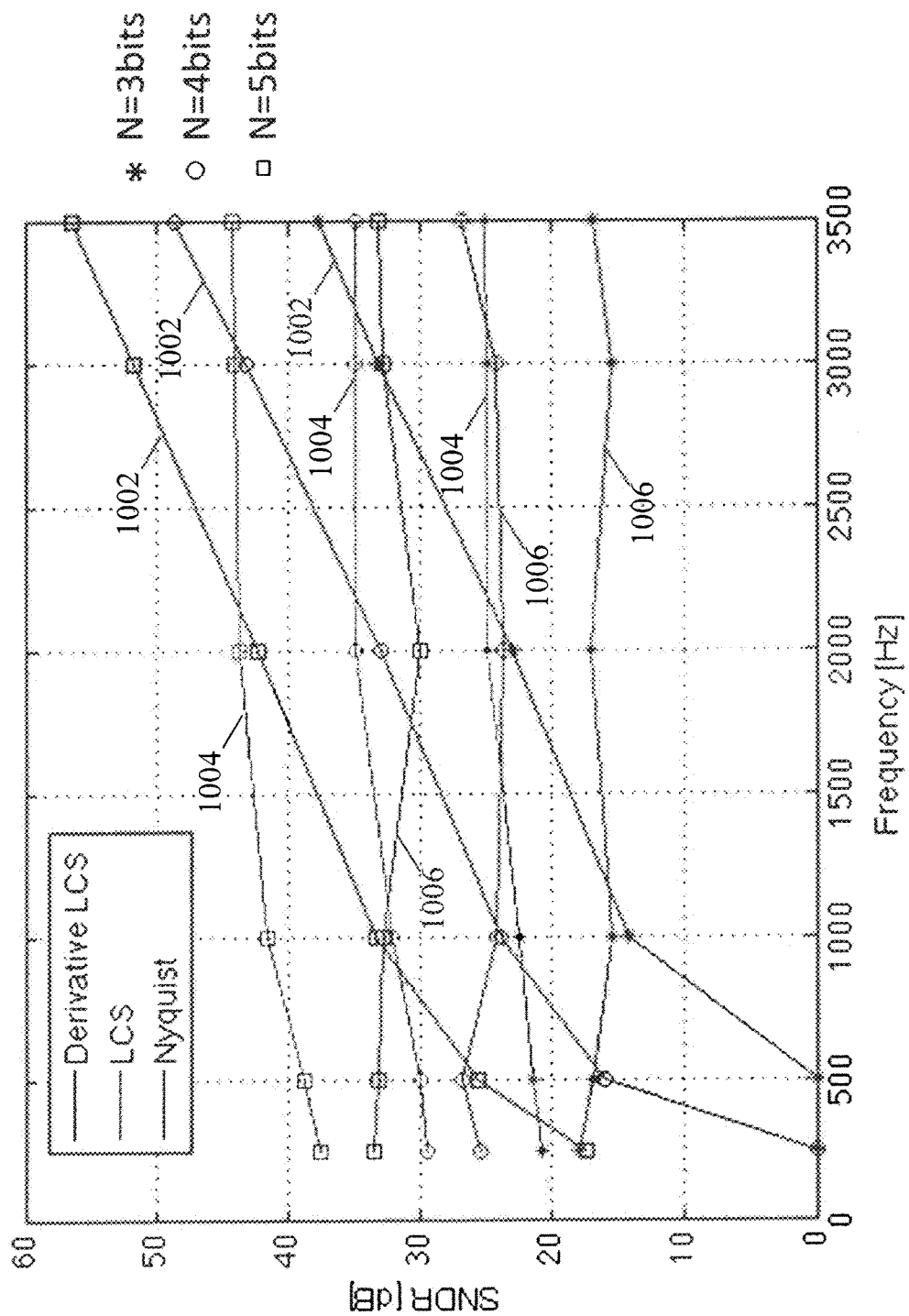
FIG. 10 illustrates a signal-to-noise and distortion-ratio (SNDR) of different sampling schemes in accordance with some embodiments.

FIG. 10 illustrates the SNDR of different sampling schemes in accordance with some embodiments. Each sampling scheme is tested for using different quantizers, e.g., 3-bit quantizer, 4-bit quantizer, and 5-bit quantizer. It is observed that in the case of reconstruction from the quantized derivative 1002—denoted by Derivative LCS (Derivative Level-Crossing Sampling)—the SNDR has a strong dependency on frequency. Conversely, for that frequency range, the SNDR of the quantized signal 1004—denoted by LCS (Level-Crossing Sampling)—as well as for the Nyquist-rate sampled quantizing 1006 is almost constant. This dependency is analogous to the one that the quantized signal has on its amplitude values. This comes from the fact that the amplitude values of the derivatives depend on its frequency together with the original signal amplitude values. In addition, it is seen that for frequencies greater than a certain frequency and number of bits of the quantizer, the SNDR is greater in the case of reconstruction from the quantized derivative 1002.

Figure 11:
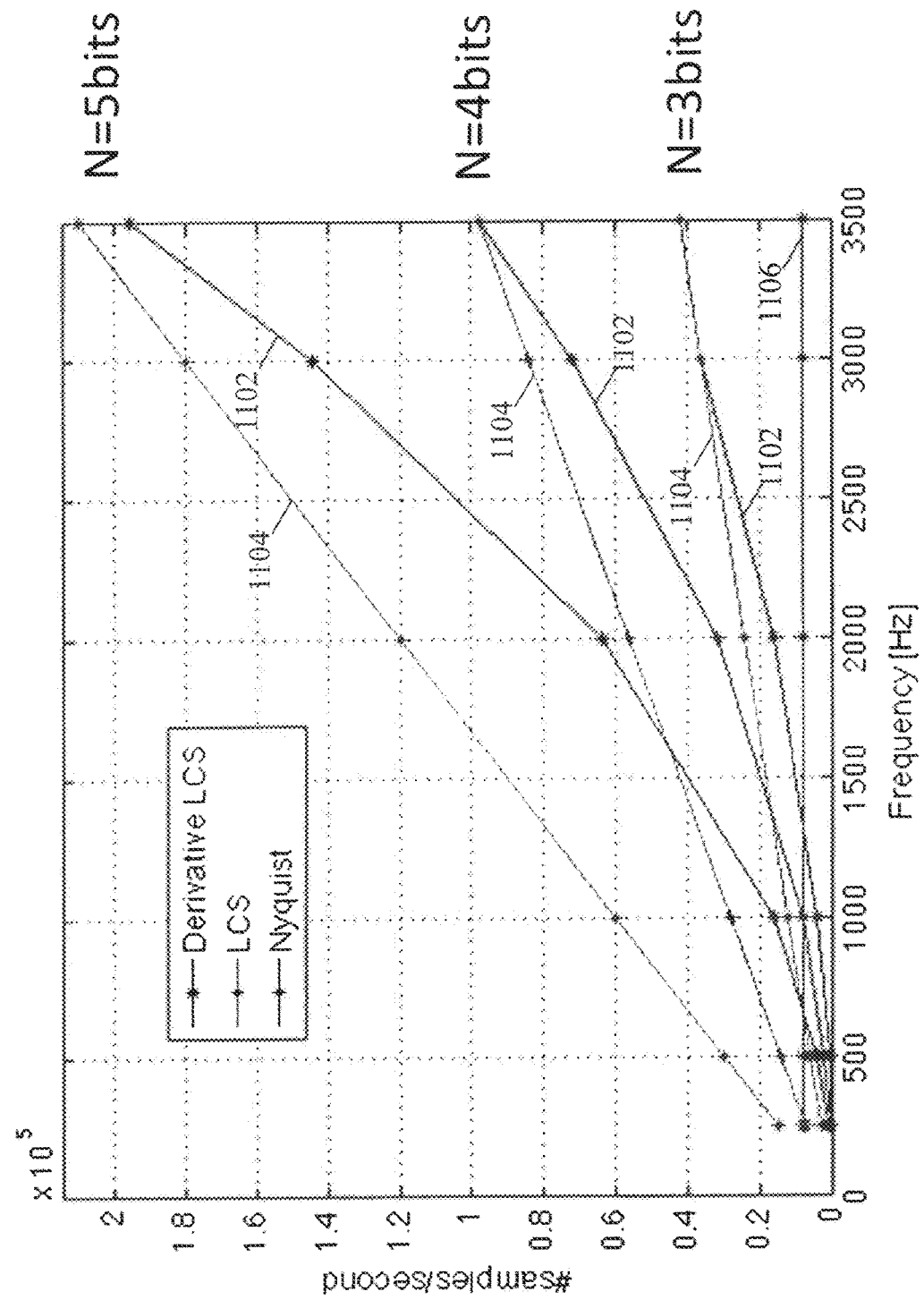
FIG. 11 illustrates, for different sampling schemes, a number of generated samples per unit time as a function of an input signal frequency in accordance with some embodiments.

FIG. 11 illustrates a number of generated samples per unit time for different sampling schemes, as a function of frequency, in accordance with some embodiments. Each sampling scheme is tested for using different quantizers, e.g., 3-bit quantizer, 4-bit quantizer, and 5-bit quantizer. FIG. 11 illustrates that for a given frequency and a number of bits of the quantizer, the number of generated samples per unit time for the derivative LCS 1102 is lower or equal to the number of generated samples per unit time for the LCS 1104. The equality can hold in the case that the maximum slope spans the entire input range of the quantizer. Note that for the Nyquist-rate sampled quantizer 1106 the number of samples per second is always the same for every frequency.

Figure 12:
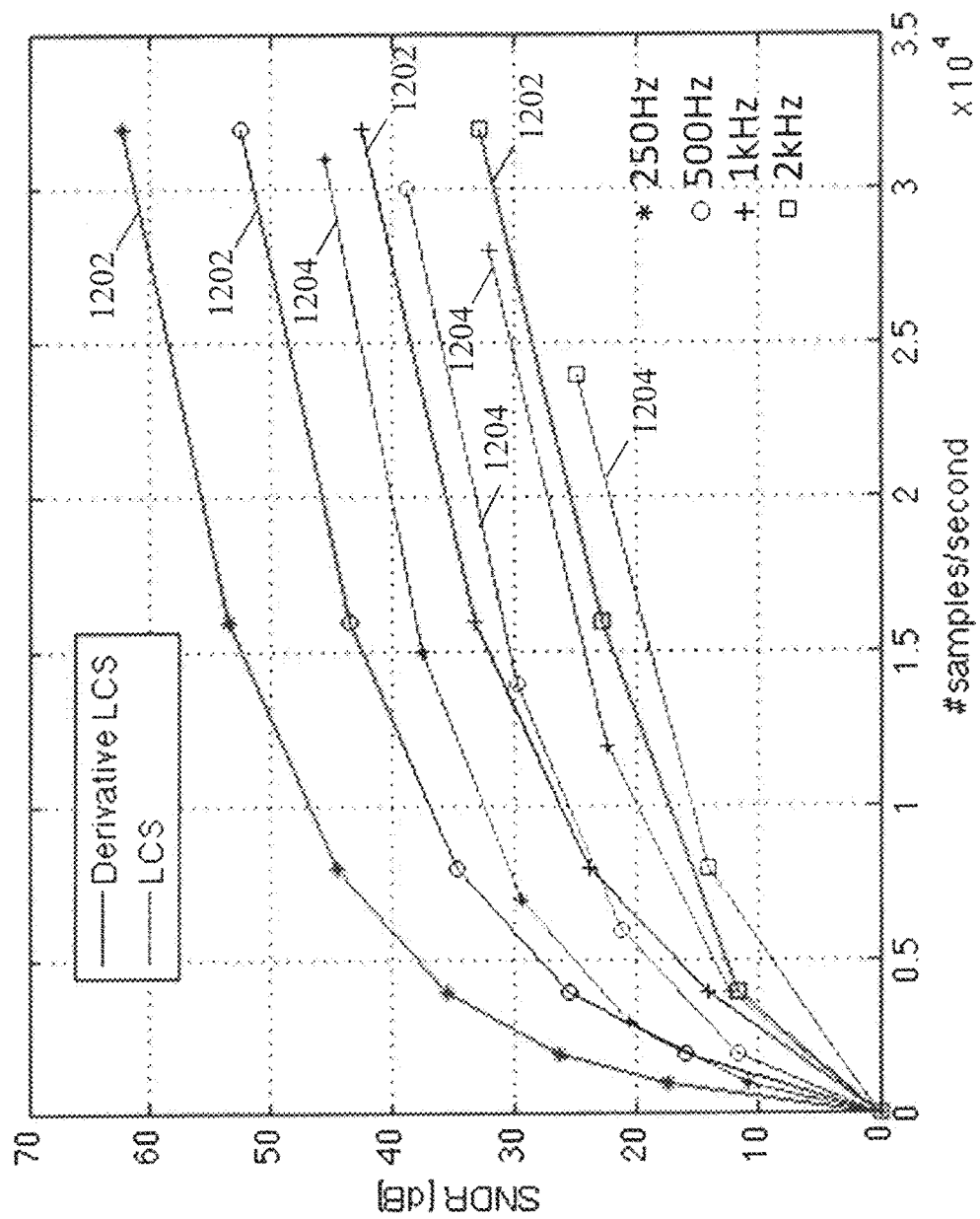
FIG. 12 illustrates an SNDR of different sampling schemes, as a function of the number of samples taken per second, in accordance with some embodiments.
Figure 13:
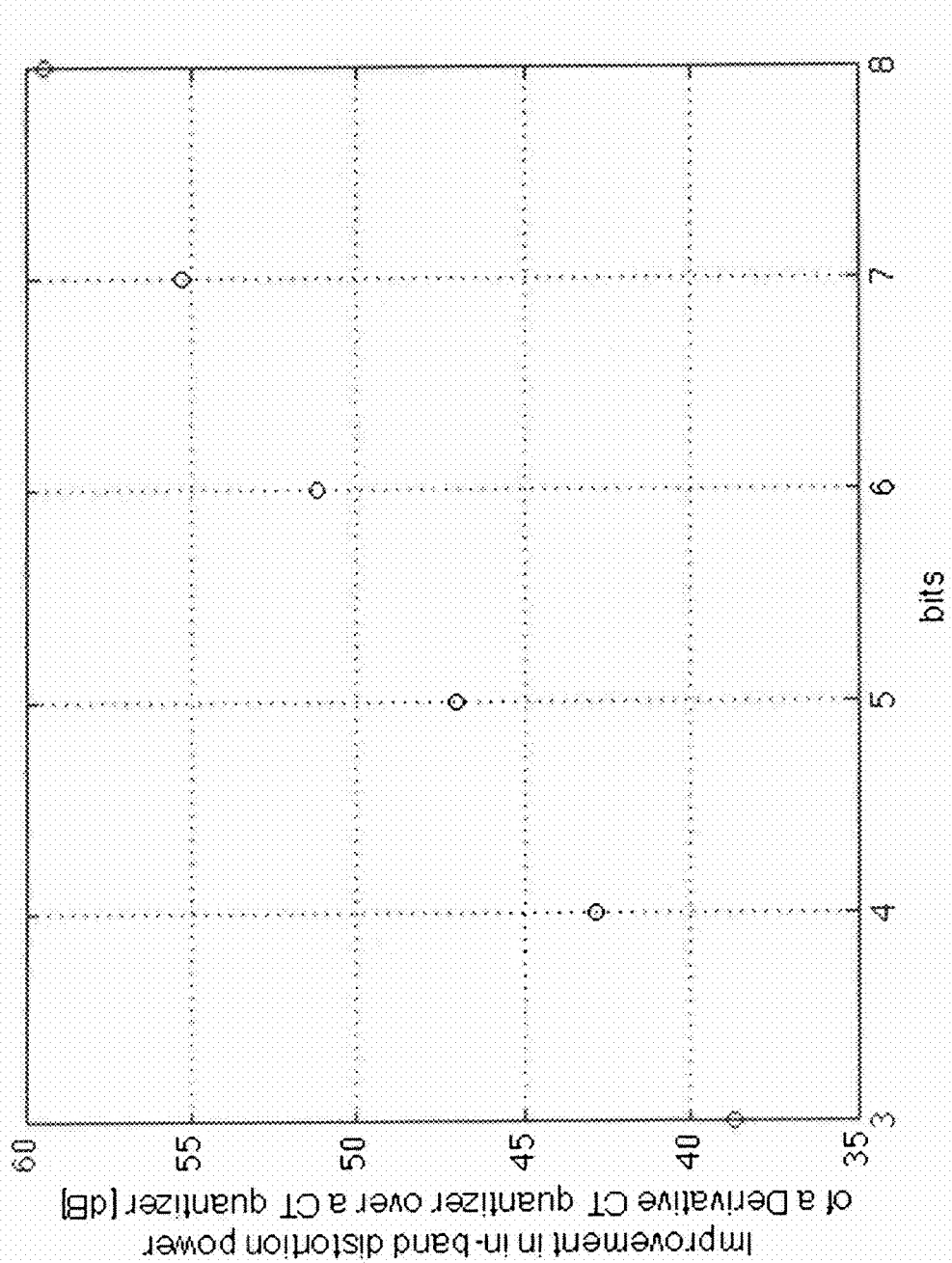
FIG. 13 illustrates improvements of an in-band quantization distortion when D-LCS is used instead of regular LCS in accordance with some embodiments.

FIG. 12 illustrates the SNDR of different sampling schemes, as a function of the number of samples taken per second, in accordance with some embodiments. The SNDR is computed for different input frequencies. It is observed that, for a given input frequency, the number of samples per second needed to reach the given SNDR can be lower in the case of Derivative LCS 1202 than the case of LCS 1204. For example, in the case of a 1 kHz sinusoidal input signal, if a SNDR of 30 dB is desired, the derivative LCS would require 4,000 samples per second. On the other hand, for the same desired SNDR, the regular LCS would require 60,000 samples per second. Therefore, the simulations indicate that the derivative LCS can reduce the number of required samples per unit time to achieve a certain SNDR. FIG. 12 does not show the Nyquist-rate quantization because the SNDR for the Nyquist-rate quantization also depends on the number of bits of the quantizer, not only on the number of samples taken per second Performance of D-L<CS for Gaussian Signals D-LCS can also be useful for more complex signals. To illustrate this point, the following analysis considers a more complex class of signals: those with a Gaussian probability density function in amplitude that are band-limited to frequency $f_o$. Again, the D-LCS is compared with the regular LCS. The analysis focuses on in-band quantization distortion, where $f < f_o$. FIG. 13 illustrates improvements of in-band quantization distortion when D-LCS is used instead of regular LCS, in accordance with some embodiments. FIG. 13 illustrates that the in-band quantization distortion is significantly lower with D-LCS compared with the regular LCS. FIG. 13 also illustrates that the improvements of in-band quantization distortion is more salient as the number of bits in the quantizer is increased. In particular, the improvements in in-band quantization distortion is increased by 3-4 dB as the number of bits in the quantizer is increased by 1 bit.

Figure 14:
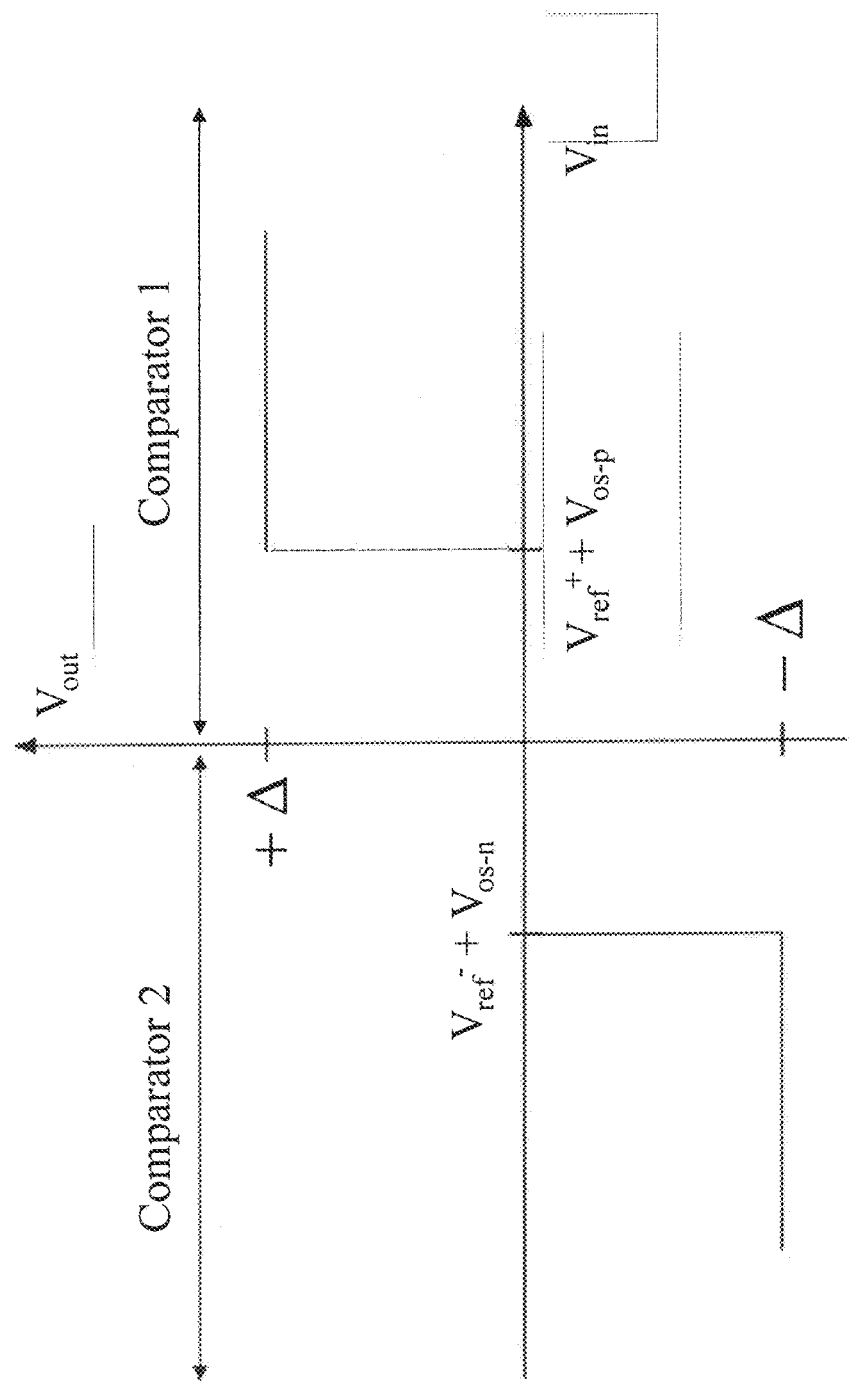
FIG. 14 illustrates an effect of input offset voltages in a quantizer in accordance with some embodiments.

In some embodiments, the quantizer 404 can include non-idealities. One of the non-idealities can include an input offset voltage. The input offset voltage of the quantizer 404 can cause the output of the integrator 406 to drift over time. For example, as discussed above, the quantizer 404 can include two or more comparators. In some cases, one or more of them can be subject to an input offset voltage. The input offset voltage of a comparator relates to the amount of input voltage needed to trigger the comparator to change its output to one of two logic states. FIG. 14 illustrates an effect of input offset voltages in a quantizer in accordance with some embodiments. The transfer function in FIG. 14 shows the combined effect of two comparators: comparator 1 and comparator 2. The comparator 1 is configured to determine whether the input voltage $V_{in}$ is greater than $V_{ref}^+$; the comparator 2 is configured to determine whether the input voltage $V_{in}$ is less than $V_{ref}^-$. The input offset voltages for comparator 1 and comparator 2 are shown by $V_{os-1}$ and $V_{os-2}$, respectively. In some cases, $V_{os-1}$ can be different from $V_{os-2}$. Based on this transfer function, when $V_{in}$ is increased from 0V, unless the input voltage $V_{in}$ crosses $V_{ref}^+ + V_{os-1}$, the output voltage of the quantizer 404 does not change to a high logic state; when $V_{in}$ is decreased from 0V, unless the input voltage $V_{in}$ crosses $V_{ref}^- + V_{os-2}$, the output voltage of the quantizer 404 does not change to a low logic state.

In some cases, the input offset voltages of the quantizer 404 can cause the output of the D-LCS system to drift over time. For example, suppose that the input signal $V_{in}$ has a derivative that is symmetric with respect to the time axis. If the quantizer 404 is ideal, the output of the quantizer 404 should also be symmetric with respect to the time axis. Therefore, the output of an ideal integrator 406 should not exhibit a DC drift over time. However, the input offset voltage of the quantizer 404, in particular the difference of the input offset voltages of two or more comparators in the quantizer 404, can cause a DC drift in the output of the quantizer 404 because the difference of the input offset voltages would be integrated by the integrator 406 over time. Therefore, the input offset voltage of the quantizer 404 can cause a drift in the output of the integrator 406.

In some embodiments, the input offset voltage of the quantizer 404 can be compensated using a feedback system. The feedback system can be configured to introduce a correction signal before the input signal reaches the quantizer 404. The correction signal can counter the input offset voltage of the quantizer 404.

Figure 15:
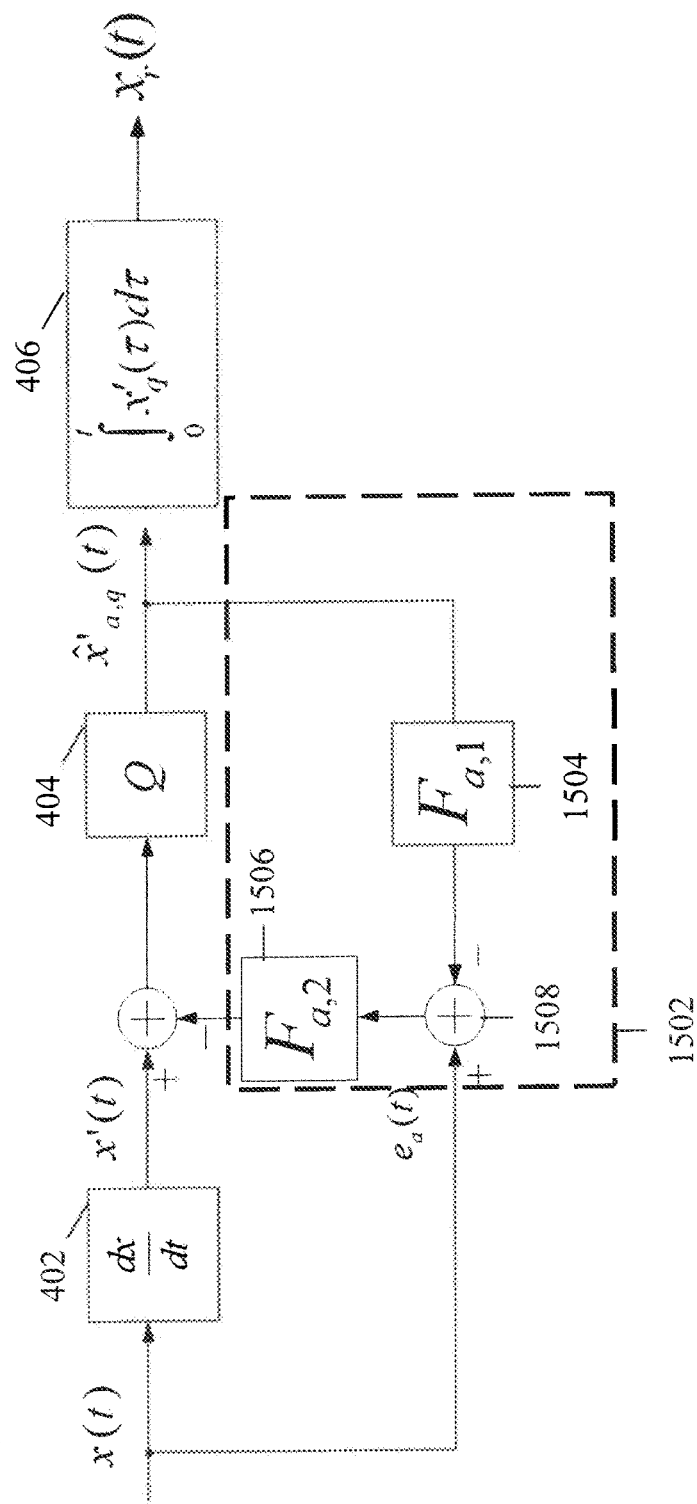
FIG. 15 illustrates a feedback system for compensating an input offset voltage of a quantizer in accordance with some embodiments.

FIG. 15 illustrates a feedback system for compensating an input offset voltage of a quantizer in accordance with some embodiments. FIG. 15 includes a differentiator 402, a quantizer 404, an integrator 406, and a feedback network 1502, including a first block 1504 configured to receive an output of the quantizer 404, a second block 1506 that receives the difference between the original signal x(t) and the output of the first block 1504, and an adder 1508.

In some embodiments, the first block 1504 can include an integrator and the second block 1506 can include a quantizer. The first block 1504 can receive the quantized derivative of the input signal, and integrate it to generate a piecewise approximation of the input signal. Subsequently, the adder 1508 can generate a difference between the input signal x(t) and the piecewise approximation of the input signal to create the error signal e(t). The error signal e(t) can be quantized using the second block 1506 and be subtracted from the output of the differentiator 402. The difference between the output of the differentiator 402 and the quantized error signal e(t) can be provided to the quantizer 404. In some cases, the block 1506 can include a differentiation operator. In other cases, the block 1506 can include a nonlinear block, such as a quantizer.

Figure 16:
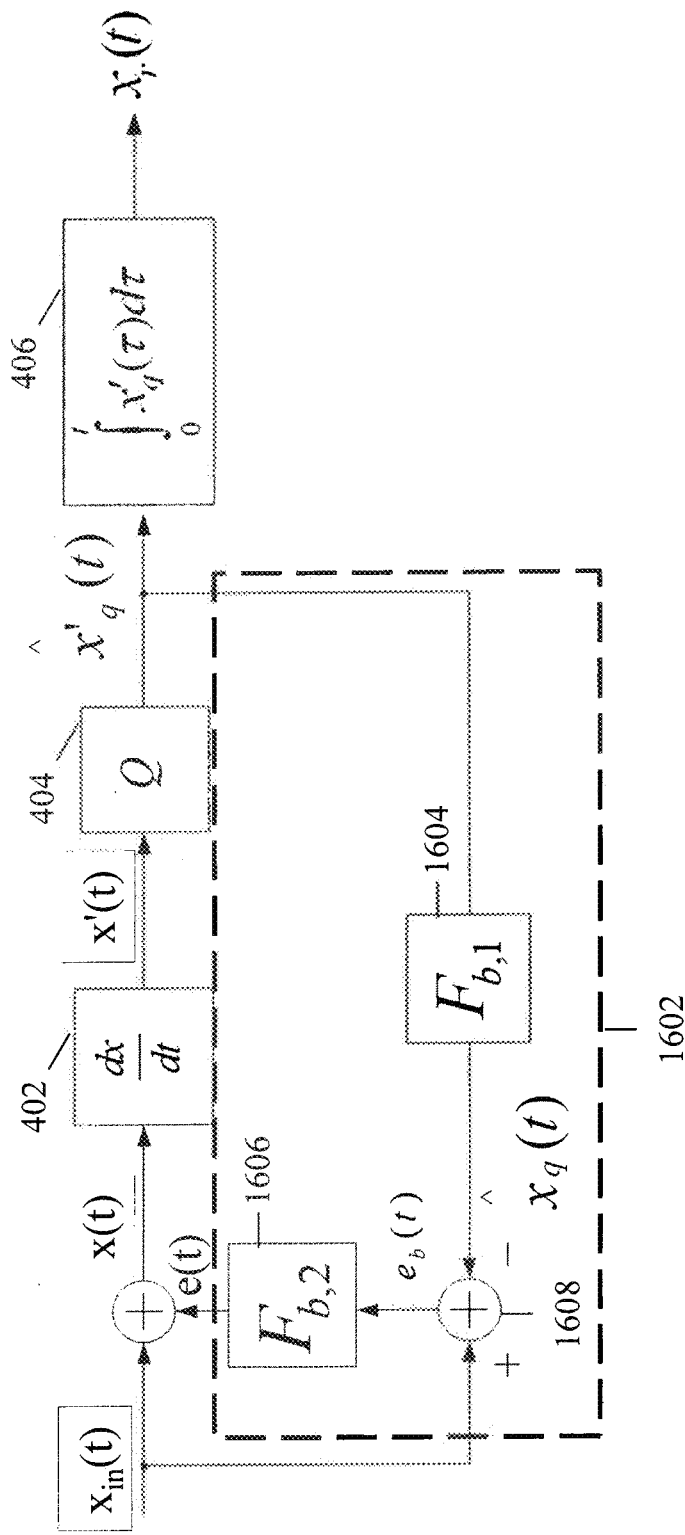
FIG. 16 illustrates another feedback system for compensating the input offset voltage of the quantizer in accordance with some embodiments.

FIG. 16 illustrates another feedback system for compensating the input offset voltage of the quantizer in accordance with some embodiments. FIG. 16 includes a differentiator 402, a quantizer 404, an integrator 406, and a feedback network 1602, including a first block 1604 configured to receive an output of the quantizer 404, a second block 1606 that receives the difference between the original signal x(t) and the first block 1604, and an adder 1608.

The feedback loop 1602 is configured so that it can compute an error signal based on the quantized derivative and the input signal, and directly compensate the input signal based on the error signal. In some embodiments, the first block 1604 can include an integrator, and the second block 1606 can include an amplifier. If the gain of the amplifier is A, then x(t) can be represented as: $x(t)=x_{in}(t)+e(t)=(1+A)x_{in}(t)-A\hat{x}_q(t)$. Assuming that the error associated with the input offset voltage of the quantizer 404 can be represented as $\eta_{OS}$ and any other types of error associated with the quantizer 404 can be represented as $\eta_q$, both which may be a function of the quantizer's input x'(t), then $\hat{x}'_q(t)=x'(t)+\eta_{OS}(x'(t))+\eta_q(x'(t))$. Thus, $\hat{x}_q(t)$ can be represented as: $\hat{x}_q(t)=\int\{(x'(t)+\eta_{OS}(x'(t))+\eta_q(x'(t))\}dt$. Using this relationship:

$$\hat{x}'_q(t) = x'_{in}(t) - \left\{ \frac{\eta_{OS}(x'(t)) + \eta_q(x'(t))}{1+A} \right\}$$

Thus, this feedback system can reduce both $\eta_{OS}$ and $\eta_q$ by increasing the gain A of the amplifier 1606. $\eta_q$ can include, among other things, the quantization error of the quantizer. Thus, this feedback system can reduce the quantization error of the quantizer 404 as well.

Figure 17:
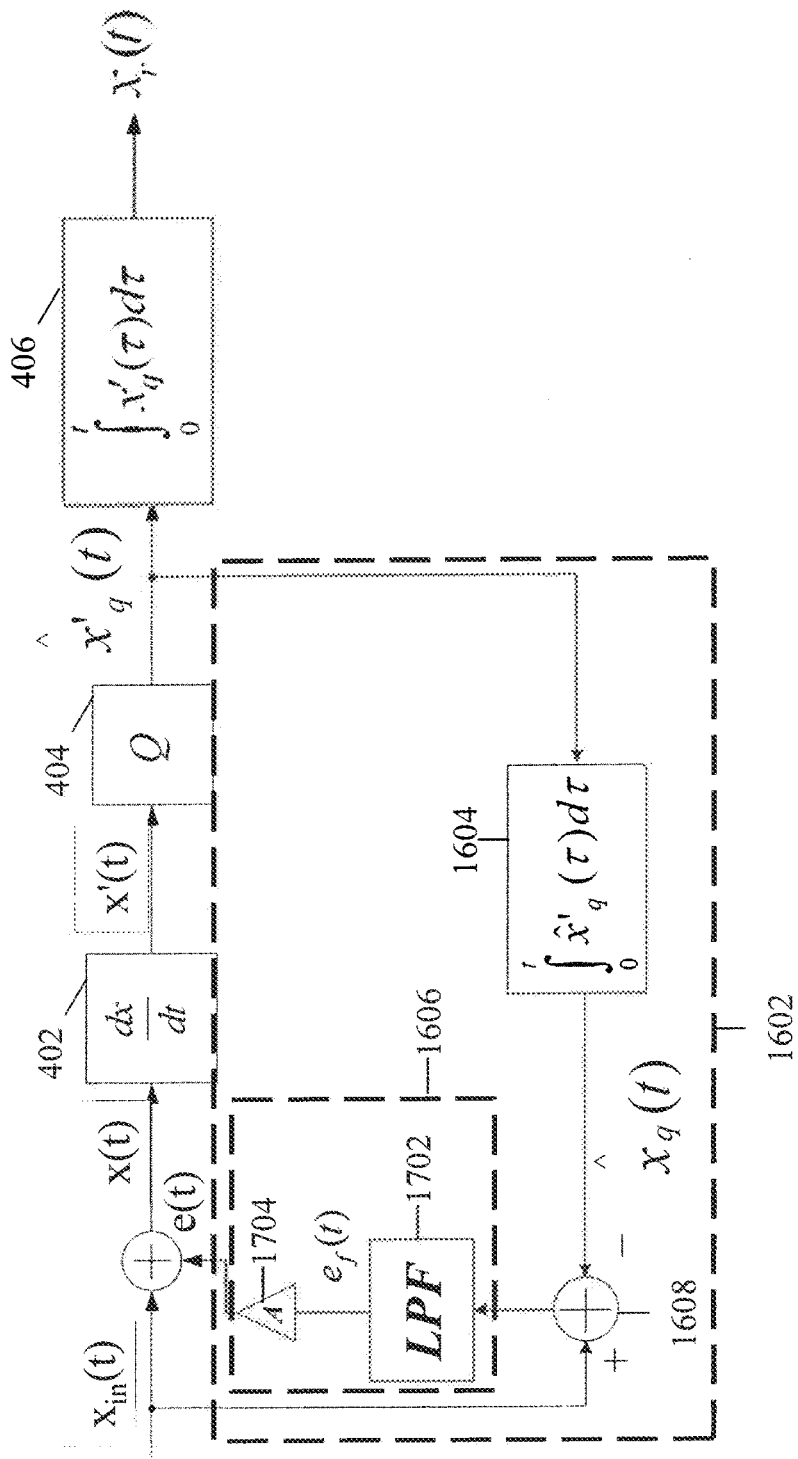
FIG. 17 illustrates an embodiment of the feedback system described in FIG. 16.

In some embodiments, the second block 1606 can include an amplifier and a filter. The filter can include a low-pass filter. FIG. 17 illustrates an embodiment of the feedback system described in FIG. 16. The second block 1606 can include a low pass filter 1702 and an amplifier 1704. The low pass filter can be configured to remove the high frequency content in the difference between $\hat{x}_q(t)$ and x(t). Removing the high frequency content in the difference between $\hat{x}_q(t)$ and x(t) can be useful to remove high frequency oscillations in the input of the quantizer 404, i.e., x'(t), which may cause the quantizer 404 to sample the signal a large number of times. The low pass filter can be a first-order low pass filter, a second-order low pass filter, or any other types of low pass filters that satisfy the cutoff frequency requirement to remove the high frequency oscillations.

Figure 18:
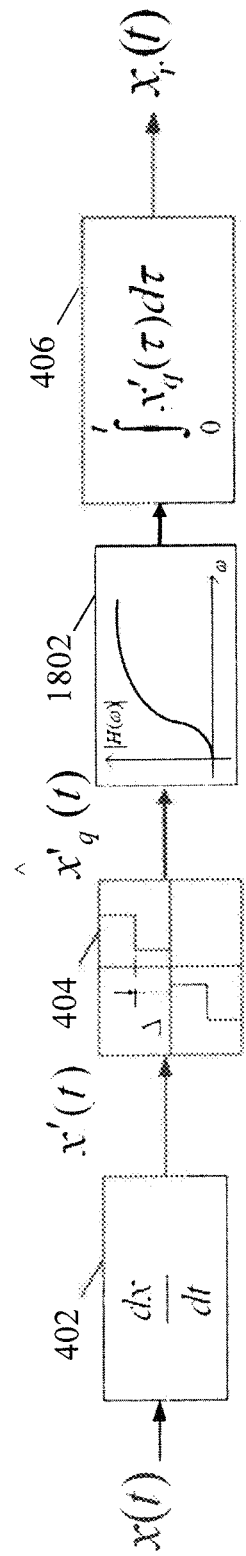
FIG. 18 illustrates an input offset voltage compensation scheme in accordance with some embodiments.

In some embodiments, the input offset voltage of the quantizer 404 can be compensated using a high pass filter in the signal path. The effect of input offset voltages is manifested as non-symmetric quantized derivatives, which can give rise to a DC component. Thus, the effect of input offset voltages can be mitigated by filtering out the DC component in the signal path. FIG. 18 illustrates an input offset voltage compensation scheme using a high pass filter in accordance with some embodiments. FIG. 18 includes a differentiator 402, a quantizer 404, a high pass filter 1802, and an integrator 406. The quantizer 404 can provide the quantized signal to the high pass filter 1802, and the high pass filter 1802 can filter out the DC component. In some embodiments, the high pass filter can include a first-order filter, a second order filter, or a higher-order filter that satisfies the cutoff frequency requirement to pass as much input signal as possible while blocking the DC component.

Another type of non-idealities associated with the quantizer 404 can include an output offset voltage. For example, a quantizer 404 can be configured to provide $V_{high}$ as a high logic state. However, for the high logic state, the quantizer 404 may provide $V_{high}+\delta_k$ instead of $V_{high}$. Here, $\delta_k$ is the output offset voltage for the high logic state. Likewise, a quantizer 404 can be configured to provide $V_{low}$ as a high logic state. However, for the high logic state, the quantizer 404 may provide $V_{low}+\delta_l$ instead of $V_{low}$. Here, $\delta_l$ is the output offset voltage for the low logic state. The output offset voltages can affect the output of the D-LCS system. In particular, the output offset voltages can manifest themselves as a DC offset in the quantized derivative. This issue can be addressed using a feedback scheme or by placing a high pass filter in the signal path, as discussed in FIGS. 15-18.

In some embodiments, the integrator 406 can be associated with one or more non-idealities. One of the non-idealities can include an offset. As discussed in FIG. 7B, the integrator can be implemented as an active integrator. The active integrator can use an operational amplifier (OPAMP) that can exhibit an input offset, just as a comparator. Taking FIG. 7B as an exemplary integrator, the output voltage $V_{out}(t)$ can be related to the input voltage $V_{in}(t)$ and the offset voltage as $V_{OS}$ follows:

$$V_{out}(t) = \frac{V_{OS}}{RC}t - \frac{1}{RC}\int V_{in}(t)dt$$

Thus, the offset voltage $V_{OS}$ can produce a voltage ramp until the OPAMP saturates, causes non-linearity in the system.

Figures 19A, 19B:
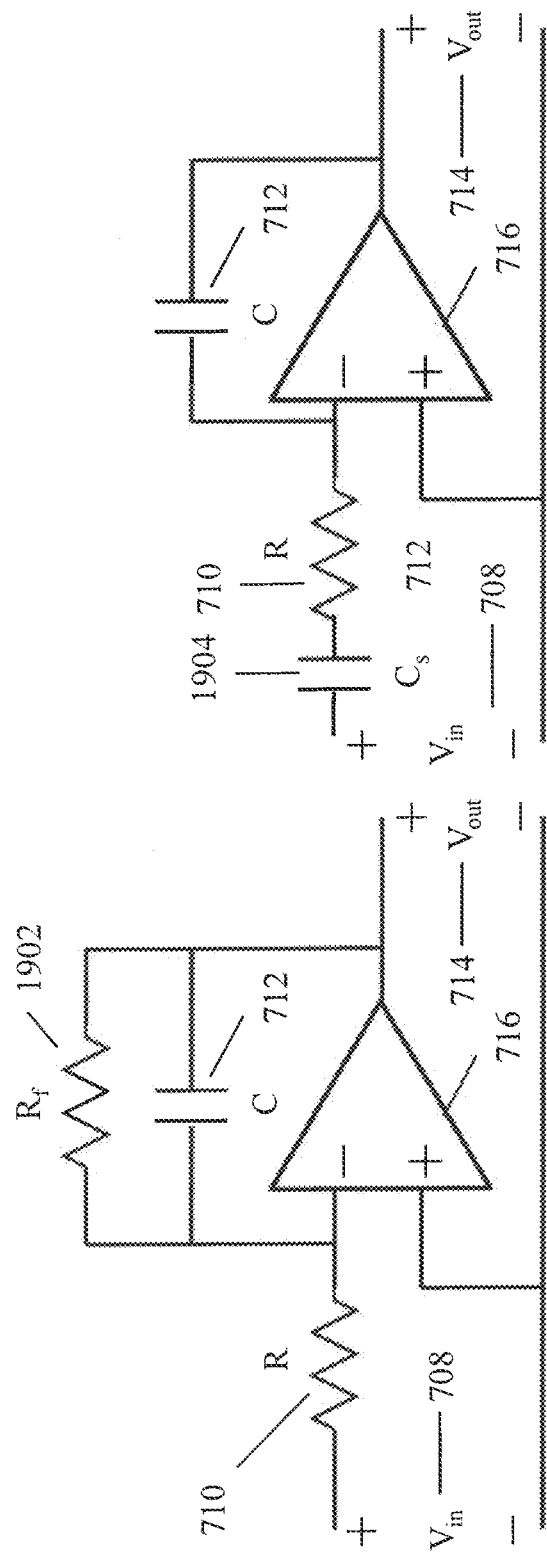
FIGS. 19A and B illustrate a voltage offset compensation scheme for an integrator in accordance with some embodiments.

In some embodiments, the effect of the offset voltage $V_{OS}$ can be addressed by using a finite DC feedback, creating a Miller integrator. FIG. 19A illustrates a Miller integrator in accordance with some embodiments. The Miller integrator includes a resistor R 710, a capacitor C 712, an OPAMP 716, as illustrated in FIG. 7B, and a feedback resistor $R_f$ 1902 in parallel with the feedback capacitor C 712. The feedback resistor $R_f$ 1902 forms a finite DC feedback for the input voltage $V_{in}$ 708 and any input offset voltage of the OPAMP 716. The feedback resistor $R_f$ 1902 can cause the offset voltage $V_{OS}$ to manifest itself as a constant offset voltage at the output, rather than a voltage ramp. In some cases, the feedback resistor $R_f$ 1902 can have a high resistance value so that the integrator does not operate as a low-pass filter.

In some embodiments, the effect of the offset voltage $V_{OS}$ can be addressed by a providing a capacitor in series with the resistor R 710 in the signal path, creating an AC coupled integrator. FIG. 19B illustrates an AC coupled integrator in accordance with some embodiments. The AC coupled integrator can include a resistor R 710, a capacitor C 712, an OPAMP 716, as illustrated in FIG. 7B, and a capacitor $C_s$ 1904 in series with the resistor R 710. When the input signal $V_{in}(t)$ has no DC signal and the capacitance of the capacitor $C_s$ 1904 is large, the input signal $V_{in}(t)$ can completely pass through the capacitor $C_s$ 1904, thereby not affecting the integration capability of the integrator.

In some embodiments, the effect of the offset voltage $V_{OS}$ can be addressed by a providing a variable resistor at the inverting input node. The variable resistor can include a potentiometer. The variable resistor can provide a voltage offset that can compensate for the offset voltage introduced by the OA integrator.

Figure 20:
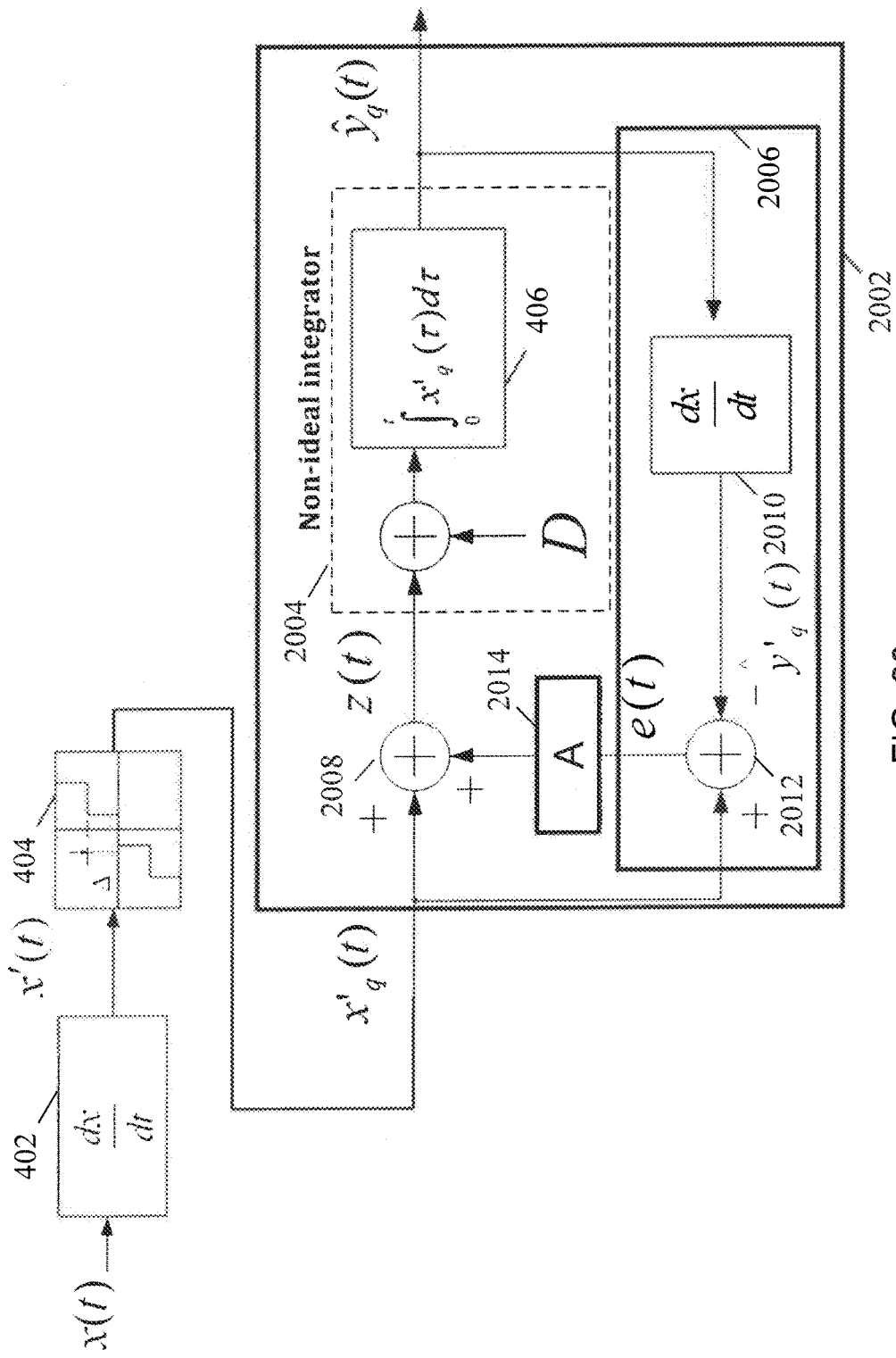
FIG. 20 illustrates a feedback system for compensating an offset voltage of an integrator in accordance with some embodiments.

In some embodiments, the effect of the offset voltage $V_{OS}$ can be addressed using a feedback compensation system. FIG. 20 illustrates a feedback system for compensating an offset voltage of an integrator in accordance with some embodiments. FIG. 20 includes a differentiator 402, a quantizer 404, and an integrator system 2002. The integrator system 2002 can include an integrator 2004, a feedback system 2006, an adder 2008, and a gain block A 2014. The feedbacks system 2006 can include a differentiator 2010 and an adder 2012. The integrator 2004 can include non-idealities, which may include the offset voltage $V_{OS}$. A signal originated from the non-idealities can be modeled as an additive signal D, which is fed to an ideal integrator 406.

The integrator system 2002 can receive a quantized signal $x'_q(t)$ from the quantizer 404. The input to the integrator 2004 is provided as: $z(t)=x'_q(t)+Ae(t)$, which is equivalent to $(1+A) x'_q(t) - A\hat{y}'_q(t)$. Since $\hat{y}'_q(t) = \int \{z(t)+D\}dt$, $$\hat{y}_q(t) = x_q(t) + \frac{D}{1+A}t.$$

Therefore, by controlling the gain A of the gain block 2014, non-idealities of the integrator 2004 can be reduced to a desired degree. The gain block 2014 can be implemented using an amplifier.

Figure 21:
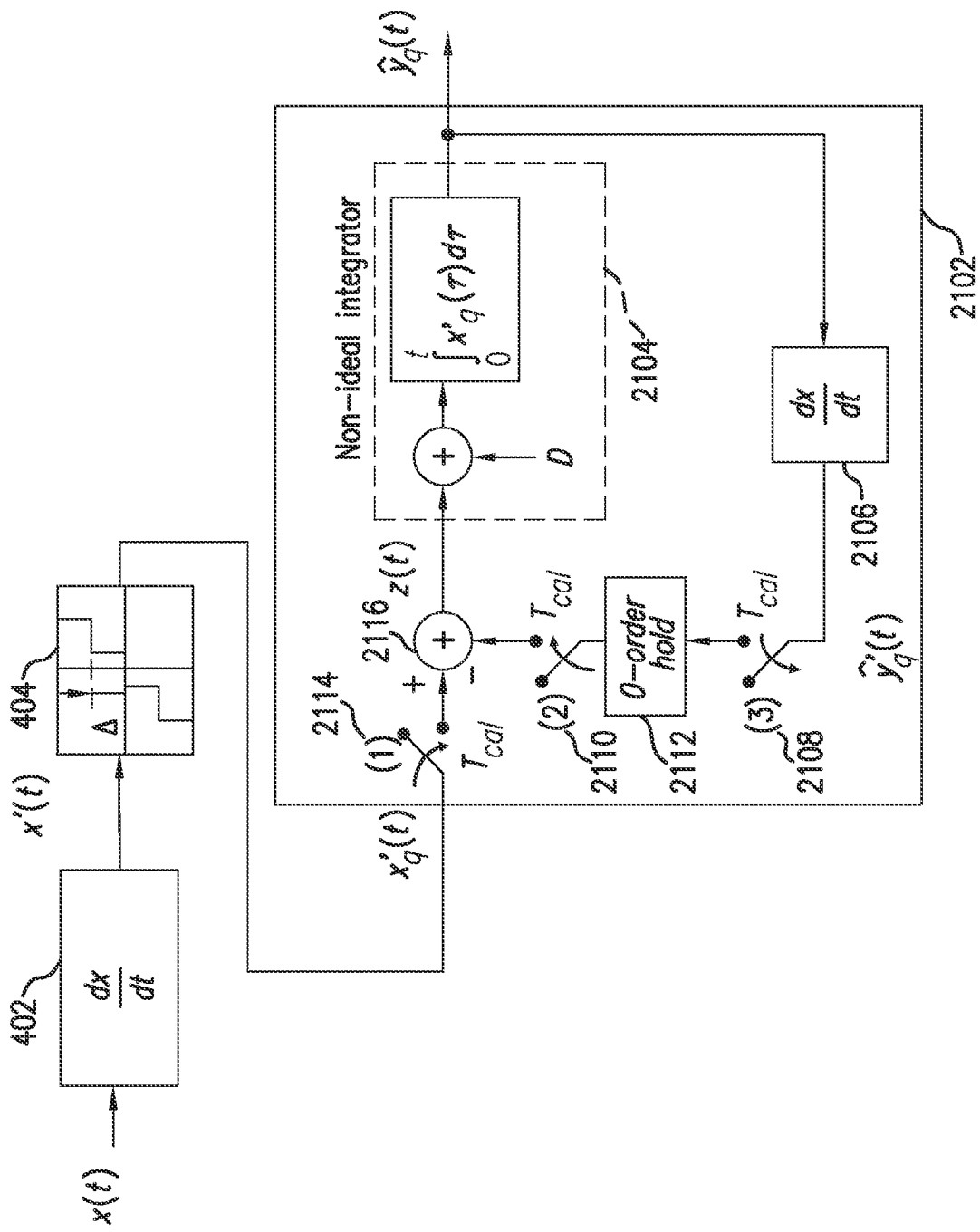
FIG. 21 illustrates a feedback system for compensating an offset voltage of an integrator using a sample-and-hold circuitry in accordance with some embodiments.

In some embodiments, the effect of the offset voltage $V_{OS}$ can be addressed using a feedback system with a sample-and-hold circuitry. FIG. 21 illustrates a feedback system for compensating an offset voltage of an integrator using a sample-and-hold circuitry in accordance with some embodiments. FIG. 21 includes a differentiator 402, a quantizer 404, and an integrator system 2102. The integrator system 2102 can include an integrator 2104, a feedback system having a differentiator 2106, switches 2108, 2110, and a hold circuitry 2112, an input sampling switch 2114, and an adder 2114. The switches 2108, 2110, and 2114, and the hold circuit 2112 can form the sample-and-hold circuitry. The sample-and-hold circuitry is configured to operate so that the hold circuitry 2112 can provide the negative of the DC offset voltage D to the adder 2116 so that $z(t)=x'_q(t)-D$.

The hold circuitry 2112 is configured to receive a constant value D during a calibration period and is configured to provide the constant value D to the adder 2116. The adder 2116 can receive the output from the 0-order hold block 2112, which is equivalent to the offset voltage D, and subtract the offset voltage D from the quantized derivative $x'_q(t)$ to create the quantized derivative $z(t)=x'_q(t)-D$. This way, when $z(t)$ enters the integrator block 2104, the offset voltage D would be compensated by the negative of the offset voltage D in $z(t)$. Thus, the feedback system illustrated in FIG. 21 can compensate for the DC offset voltage D of the integrator.

In some embodiments, the hold circuitry 2112 can include a capacitor. In some cases, the capacitor in the hold circuitry 2112 can be periodically refreshed so that the hold circuit 2112 can maintain a constant voltage over a prolonged period of time. In some embodiments, the hold circuitry 2112 can be a 0-order hold circuit.

Applications

Figure 22:
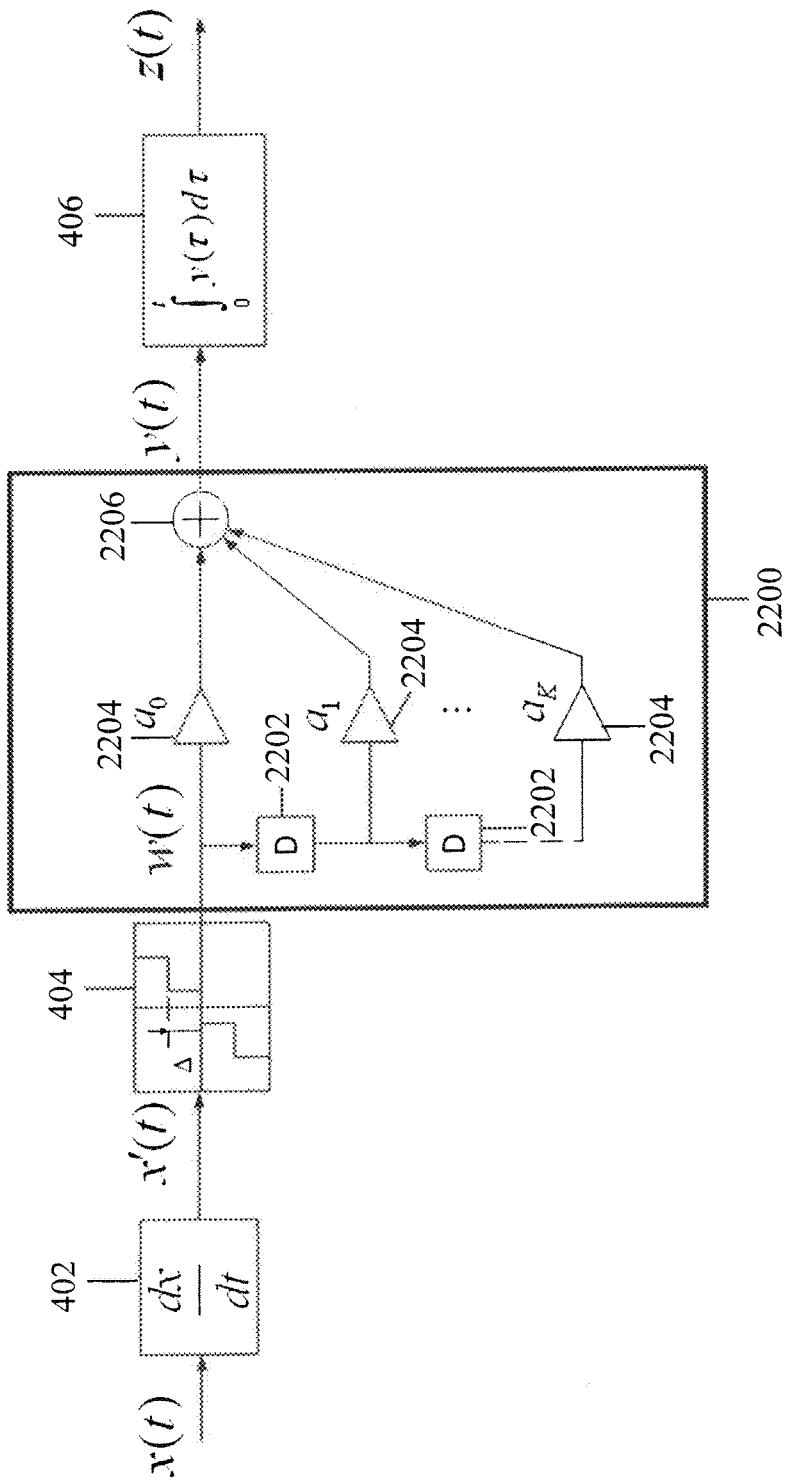
FIG. 22 illustrates the D-LCS based continuous-time digital signal processing in accordance with some embodiments.

D-LCS can be useful in many applications, including continuous-time digital signal processing (CT DSP.) D-LCS based CT DSP processes analog signal in the quantized domain and still provide the functionality of a regular CT DSP. FIG. 22 illustrates the D-LCS based CT DSP in accordance with some embodiments. FIG. 22 includes a differentiator 402, a derivative quantizer 404, a processing block 2200, and an integrator 406. The processing block 2200 can further include at least one delay element 2202, at least one analog multiplier 2204, and a summation block 2206.

The processing block 2200 can be configured as a classical analog transversal system. The classical analog transversal system can be represented using a continuous-time transfer function, which can be written as follows in the Laplace domain:

$$H(s) = \sum_{k=0}^{K} a_k (e^{sT})^{-k}$$

where T is the delay of one delay element, $a_k$ is the multiplication factor of the multipliers, and K is the number of delay elements.

The transfer function of the D-LCS based CT DSP in FIG. 22 can be identical to the transfer function of the processing block 2200. This can be analytically shown as follows. Let $x(t) \in V$ be an input signal. This input signal is provided to the differentiator 402, and the differentiator 402 processes this input signal to provide a differentiated signal $x'(t)$. The derivative quantizer 404 receives the differentiated signal $x'(t)$, and generates a quantized representation $w(t)$ of the differentiated signal $x'(t)$. The quantized representation $w(t)$ is also called the quantized derivative $w(t)$. The quantized derivative $w(t)$ can be represented as follows:

$$w(t) = \sum_{n=1}^{N} 2^{-n} b_n(t)$$

where $b_n(t)$ are the bit waveforms. The quantized derivative $w(t)$ are processed by the processing block 2200 to provide the processed derivative $y(t)$, where the processed derivative $y(t)$ can be represented as follows:

$$y(t) = \sum_{n=1}^{N} 2^{-n} \sum_{k=0}^{K} a_k b_n(t-kT)$$

Taking the Laplace Transform:

$$Y(s) = H(s) \sum_{n=1}^{N} 2^{-n} B_n(s)$$

Therefore, the output of the system in the Laplace domain Z(s) has the form:

$$Z(s) = Y(s)\frac{1}{s} = \frac{H(s)1}{s} \sum_{n=1}^{N} 2^{-n} B_n(s)$$

Also note that:

$$W(s) = \sum_{n=1}^{N} 2^{-n} B_n(s) = X_D(s) = X(s)s$$

Therefore, for the output of the system:

$$Z(s) = Y(s)\frac{1}{s} = H(s)\frac{1}{s} X_D(s) = H(s)X(s)$$

Therefore, the transfer function of the D-LCS based CT DSP of FIG. 22 can be equivalent to the transfer function of the processing block 2200. The CT DSP of FIG. 22 can provide the benefits of processing signals digitally while leveraging the characteristics of the analog processing block 2200, as long as the quantizer 404 is adjusted to the range of the derivatives associated with the input signal.

In some embodiments, the processing block 2200 can be configured to operate on the per-level representation of the derivative of the input signal. For example, each line within the processing block 2200 can represent a plurality of channels, each carrying s(t) associated with a particular quantization threshold, as illustrated in FIG. 5B. In other embodiments, the processing block 2200 can be configured to operate on a step-wise approximation of the derivative of the input signal.

In some embodiments, the processing block 2200 embodying the CT DSP can be implemented using a hardware description language. The hardware description language can include a Very-High-Speed Integrated Circuits Hardware Description Language (VHDL), Verilog®, Ruby Hardware Description Language (RHDL), Bluespec™, and MyHDL.

In some embodiments, the multiplier 2204 can include an amplifier. The gain $a_k$ of the amplifier 2204 can depend on a weight associated with a delayed version of the input signal. The weight associated with a delayed version of the input signal can depend on the particular digital filter implemented by the processing block 2200.

In some embodiments, the processing block 2200 can be used in conjunction with embodiments discussed in the present disclosure, including embodiments disclosed in FIGS. 15-18, 20, and 21.

The CT DSP of FIG. 22 can be useful in many applications, including biomedical applications. For example, the CT DSP of FIG. 22 can be used in processing bio-signals from a human body, including an electrocardiogram (ECG) signal, an electroencephalography (EEG) signal, an electrocorticography (ECoG) signal, an electromyogram (EMG) signal, an electroneurogram signal, an electropalatography (EPG) signal, and a hemoencephalography (HEG) signal.

In some embodiments, the differentiator 402, the quantizer 404, the processing block 2200, and the integrator 406 can be embodied in separate dies. In other embodiments, one or more of the differentiator 402, the quantizer 404, the processing block 2200, and the integrator 406 can be embodied in a single die. For example, the differentiator 402 and the quantizer 404 can be embodied in a first die, and the processing block 2200 and the integrator 406 can be embodied in a second die. In other embodiments, the differentiator 402, the quantizer 404, the processing block 2200, and the integrator 406 can all be embodied in the same die.

Figure 23:
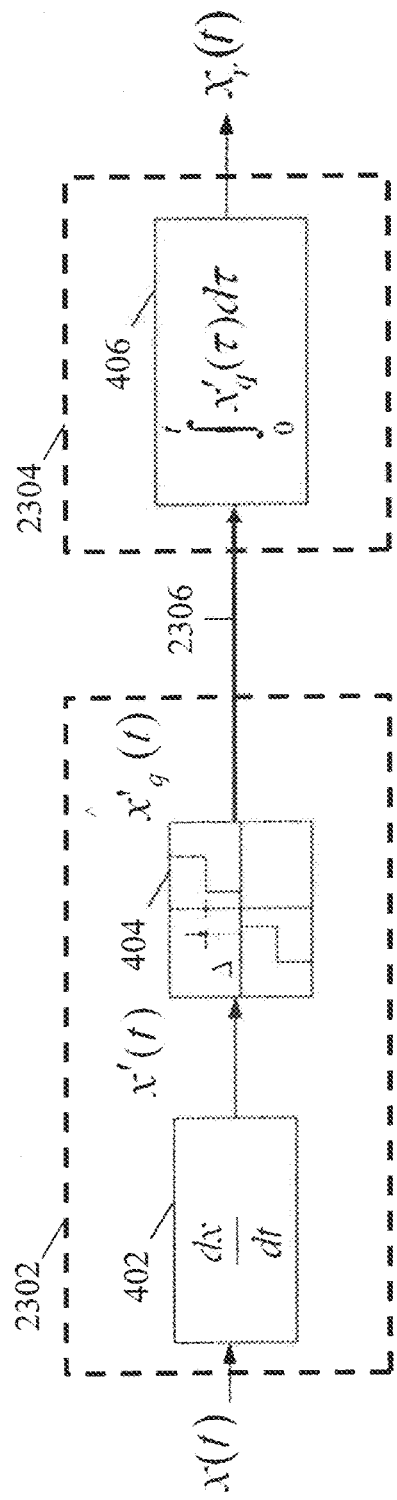
FIG. 23 illustrates a communication system implementing the D-LCS scheme in accordance with some embodiments.

In some embodiments, the D-LCS scheme can provide a communication mechanism between two systems. FIG. 23 illustrates a communication system implementing the D-LCS scheme in accordance with some embodiments. The communication system includes a transmitter 2302 and a receiver 2304, and the transmitter 2302 and the receiver 2304 can communicate over a communication channel 2306. The transmitter 2302 can include a differentiator 402 and a quantizer 404, and the receiver 2304 can include an integrator. The transmitter 2302 can use the differentiator 402 to differentiate an input signal to provide a derivative of an input signal to a quantizer 404, and the quantizer 404 can quantize the derivative of the input signal to provide a quantized derivative of the input signal. The transmitter 2302 can subsequently transmit the quantized derivative of the input signal over the communication channel 2306. In some cases, the transmitter 2302 can include a transmission block for transmitting the quantized derivative of the input signal over the communication channel 2306.

The receiver 2304 can receive the quantized derivative of an input signal from the transmitter 2302, and provide the quantized derivative of the input signal to the integrator 406. The integrator 406 can integrated the quantized derivative of the input signal to recover the quantized version of the input signal.

In some embodiments, the communication channel 2306 can include a wired communication channel. The wired communication channel can include a high speed link of a computing system, a system bus within a computing system, a wire trace on a printed circuit board (PCB), a waveguide for high-power applications, a fiber-optics communication channel, a cable internet access channel, and a telephone network channel.

In some embodiments, the communication channel 2306 can include a wireless communication channel. The wireless communication channel can include a channel in a radio access network of a cellular network, including 3rd Generation Partnership Project (3GPP) communication systems such as a Long Term Evolution (LTE), an LTE advanced, a Universal Mobile Telecommunications System (UMTS), and a Global System for Mobile Communications (GSM), a WiFi network channel, a Satellite network channel, a Global Positioning System (GPS) network channel, and a WiMAX network channel.

In some embodiments, the communication system of FIG. 23 can be augmented with a processing block to provide a flexible communication system. FIGS. 24A-24B illustrate a flexible communication system based on the D-LCS scheme in accordance with some embodiments. In some embodiments, the flexibility of the communication system can be provided on the transmitter side. For example, FIG. 24A includes an enhanced transmitter 2402 and a traditional receiver 2304. The enhanced transmitter 2402 can include a differentiator 402, a quantizer 404, and a processing block 2404. The processing block 2404 can be configured to process the quantized derivative of the input signal before transmitting the quantized derivative to the receiver 2304. In some cases, the processing block 2404 can include a continuous-time DSP (CT-DSP) 2200. The CT-DSP 2200 can be designed as discussed with respect to FIG. 22. In other cases, the processing block 2404 can include continuous time filters, such as he high pass filter 1802.

In some embodiments, the flexibility of the communication system can be provided on the receiver side. For example, FIG. 24B includes a regular transmitter 2302 and an enhanced receiver 2406. The enhanced receiver 2406 can include a processing block 2408 and an integrator 406. When the transmitter 2302 sends the quantized derivative of the input signal over the communication network 2306, the receiver 2404 can provide the quantized derivative to the processing block 2408 to process the quantized derivative. Subsequently, the processing block 2408 can provide the processed quantized derivative to the integrator 406 so that the integrator 406 can restore the processed version of the input signal. In some cases, the processing block 2408 can include a continuous-time DSP (CT-DSP) 2200. In other cases, the processing block 2408 can include continuous time filters, such as the high pass filter 1802.

In some embodiments, the flexibility of the communication system can be provided both on the transmitter side and on the receiver side. The flexibility can be provided using the processing blocks 2406, 2408.

Figure 25:
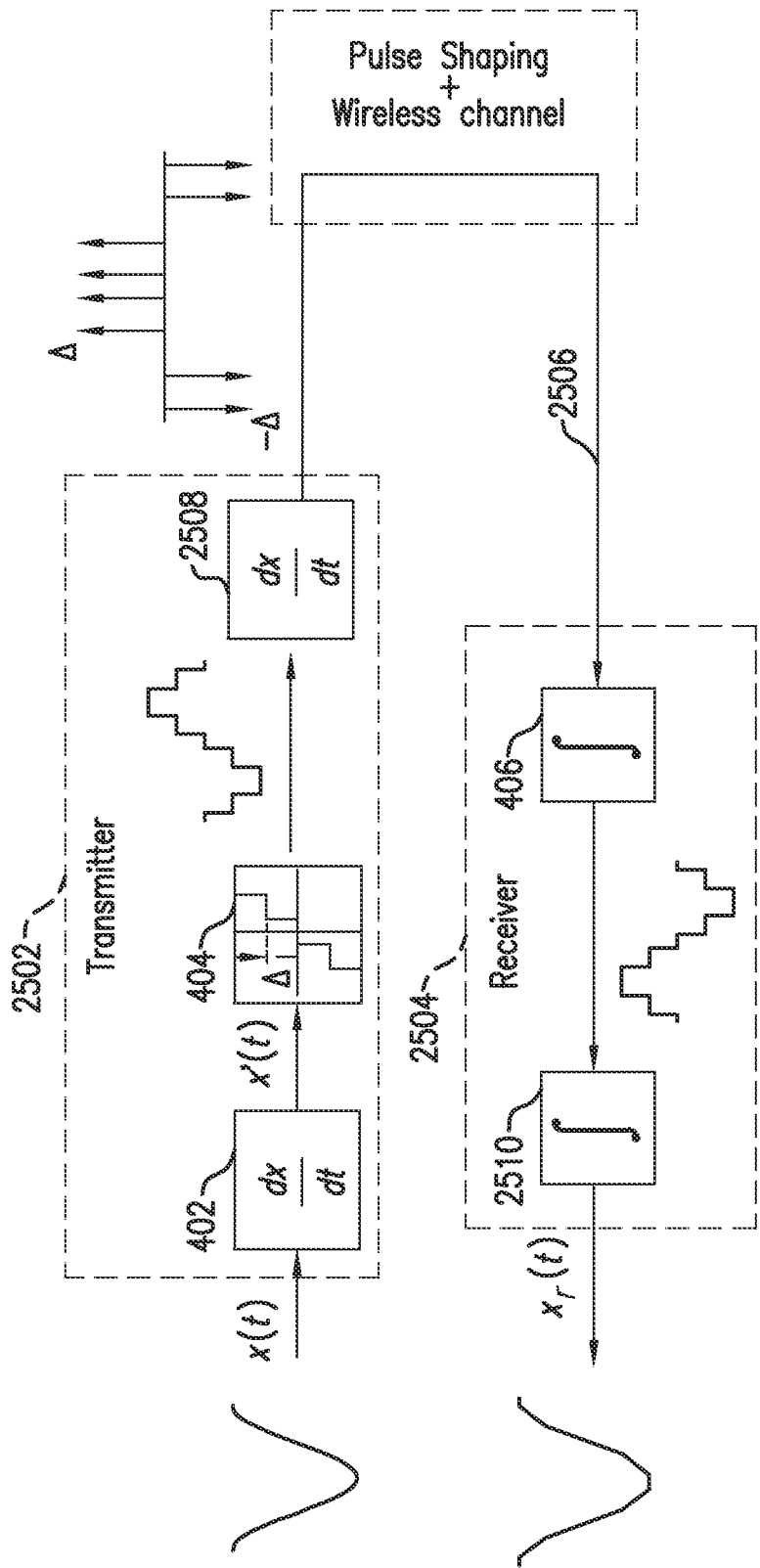
FIG. 25 illustrates an Ultra Wide Band (UWB) communication system based on the D-LCS scheme in accordance with some embodiments.

In some embodiments, the D-LCS scheme can provide an Ultra Wide Band (UWB) communication system. FIG. 25 illustrates a UWB communication system based on the D-LCS scheme in accordance with some embodiments. The UWB communication system can include a transmitter 2502, a receiver 2504, and a communication channel 2506 over which the transmitter 2502 and the receiver 2504 can communicate. The transmitter 2502 can include a first differentiator 402, a quantizer 404, and a second differentiator 2508. The receiver 2504 can include a first integrator 406 and a second integrator 2510. The transmitter 2502 can be configured to receive an input signal. The transmitter 2502 can subsequently provide the input signal to the first differentiator 402, and the first differentiator 402 can differentiate the input signal to provide the derivative of the input signal to the quantizer 404. The quantizer 404 can quantize the derivative of the input signal and provide a step-wise approximation of the derivative of the input signal to the second differentiator 2508. The second differentiator 2508 can differentiate the step-wise approximation of the derivative to generate a sequence of impulses. The transmitter 2502 can subsequently transmit the sequence of impulses over the UWB communication channel 2506. In some embodiments, the transmitter 2502 can shape the sequence of impulses using a pulse shaping technique before transmitting the sequence of impulses over the UWB communication channel 2506.

The receiver 2504 can subsequently receive the sequence of impulses from the UWB channel 2506. The receiver 2504 can subsequently integrate the sequence of impulses twice, using the first integrator 406 and the second integrator 2510, to regenerate the input signal.

Other embodiments, extensions, and modifications of the ideas presented above are comprehended and should be within the reach of one versed in the art upon reviewing the present disclosure. Accordingly, the scope in its various aspects should not be limited by the examples presented above. The individual aspects, and the entirety should be regarded so as to allow for such design modifications and future developments within the scope of the present disclosure. The disclosed subject matter can be limited only by the claims that follow.

We claim:

1. A circuit system comprising:
a differentiator configured to receive an input signal and to provide a derivative of the input signal; and
a quantizer coupled to the differentiator, configured to receive the derivative of the input signal and to sample the derivative of the input signal when the derivative of the input signal crosses one of a plurality of quantization thresholds to provide a quantized derivative of the input signal; and
a continuous time digital signal processing block coupled to the quantizer, configured to receive the quantized derivative of the input signal and process the quantized derivative of the input signal to provide a derivative of an output signal; and
an integrator coupled to the continuous time signal processing block, configured to receive the derivative of the output signal and to integrate the derivative of the output signal to provide the output signal.

2. The circuit system of claim 1, wherein the quantizer is configured to represent the quantized derivative of the input signal using a per-level representation.

3. The circuit system of claim 2, wherein the quantizer comprises a flash analog-to-digital converter.

4. The circuit system of claim 1, wherein the quantizer is associated with a finite offset voltage, and wherein the circuit system further comprises a feedback system configured to compensate for the finite offset voltage associated with the quantizer.

5. The circuit system of claim 1, wherein the continuous time digital signal processing block comprises at least one analog multiplier and a summation block.

6. The circuit system of claim 1, wherein the continuous time digital signal processing block is configured to receive the quantized derivative of the input signal represented in a per-level representation.

7. The circuit system of claim 1, wherein the integrator is associated with a finite offset voltage, and wherein the circuit system further comprises a feedback system configured to compensate for the finite offset voltage associated with the integrator.

8. The circuit system of claim 1, wherein the input signal comprises a bio-signal from a human body.

9. A method of processing an input signal using a circuit system, the method comprising:
receiving, at a differentiator, the input signal;
determining, using the differentiator, a derivative of the input signal;
determining, using a quantizer coupled to the differentiator, a plurality of time points at which the derivative of the input signal crosses one of a plurality of quantization thresholds; and
sampling, using the quantizer, the derivative of the input signal at the plurality of time points to provide a quantized derivative of the input signal processing the quantized derivative of the input signal to provide a derivative of an output signal;
wherein sampling the derivative of the input signal at the plurality of time points to provide the quantized derivative of the input signal comprises determining a per-level representation of quantized derivative of the signal;
wherein integrating, using an integrator, the derivative of the output signal to provide the output signal.

10. The method of claim 9, wherein the plurality of quantization thresholds comprises a first quantization threshold, a second quantization threshold, and a third quantization threshold, wherein the first quantization threshold, the second quantization threshold, and the third quantization threshold are consecutive thresholds, and wherein a first difference between the first quantization threshold and the second quantization threshold is different from a second difference between the second quantization threshold and the third quantization threshold.

11. The method of claim 9, wherein the quantizer is associated with a finite offset voltage, and wherein the method further comprises compensating for the finite offset voltage associated with the quantizer using a feedback system.

12. The method of claim 9, wherein the integrator is associated with a finite offset voltage, and wherein the method comprises compensating for the finite offset voltage associated with the integrator using a feedback system.

13. A communication system for communicating over a communication channel, the communication system comprising:
a differentiator configured to receive an input signal and to provide a derivative of the input signal;
a quantizer coupled to the differentiator, configured to receive the derivative of the input signal and to sample the derivative of the input signal when the derivative of the input signal crosses one of a plurality of quantization thresholds to provide a quantized derivative of the input signal; and
a transmission block coupled to the quantizer, configured to receive the quantized derivative of the input signal and to transmit the quantized derivative of the input signal over the communication channel; and
wherein a continuous time digital signal processing block coupled to the quantizer, configured to receive the quantized derivative of the input signal and to process the quantized derivative of the input signal to provide a processed quantized derivative of the input to the transmitter, wherein the transmission block is further configured to transmit the processed quantized derivative of the input signal over the communication channel.

14. The communication system of claim 13, comprising a receiver, configured to receive the quantized derivative of the input signal from the communication channel, further configured to integrate the quantized derivative of the input signal to provide an output signal.

15. The communication system of claim 13, wherein the input signal comprises a bio-signal from a human body.

* * * * *